US008580667B2

(12) United States Patent
Lui et al.

(10) Patent No.: US 8,580,667 B2
(45) Date of Patent: Nov. 12, 2013

(54) SELF ALIGNED TRENCH MOSFET WITH INTEGRATED DIODE

(75) Inventors: Sik Lui, Sunnyvale, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 174 days.

(21) Appl. No.: 12/968,179

(22) Filed: Dec. 14, 2010

(65) Prior Publication Data

US 2012/0146090 A1    Jun. 14, 2012

(51) Int. Cl.
*H01L 21/3205* (2006.01)

(52) U.S. Cl.
USPC ..... 438/589; 438/237; 438/270; 257/E29.201

(58) Field of Classification Search
USPC ............... 257/E21.359, E21.419, E21.585, 257/E29.201; 438/138, 237, 272, 270, 589
See application file for complete search history.

(56) References Cited

U.S. PATENT DOCUMENTS

| | | | |
|---|---|---|---|
| 5,801,417 A * | 9/1998 | Tsang et al. | 257/333 |
| 5,897,343 A * | 4/1999 | Mathew et al. | 438/133 |
| 6,916,745 B2 * | 7/2005 | Herrick et al. | 438/700 |
| 7,060,567 B1 * | 6/2006 | Hsu | 438/270 |
| 7,390,717 B2 * | 6/2008 | Cao et al. | 438/270 |
| 7,598,144 B2 * | 10/2009 | Herrick et al. | 438/272 |
| 7,767,526 B1 * | 8/2010 | Lee et al. | 438/268 |
| 8,174,067 B2 * | 5/2012 | Yedinak et al. | 257/334 |
| 8,187,941 B2 * | 5/2012 | Nakazawa et al. | 438/270 |
| 8,193,580 B2 * | 6/2012 | Chen et al. | 257/331 |
| 8,236,651 B2 * | 8/2012 | Chen et al. | 438/270 |
| 8,431,457 B2 * | 4/2013 | Chang et al. | 438/270 |
| 2003/0096479 A1 * | 5/2003 | Hshieh et al. | 438/270 |
| 2008/0135931 A1 * | 6/2008 | Challa et al. | 257/331 |
| 2008/0138953 A1 * | 6/2008 | Challa et al. | 438/270 |
| 2008/0265312 A1 * | 10/2008 | Bhalla et al. | 257/328 |
| 2009/0020810 A1 * | 1/2009 | Marchant | 257/331 |
| 2009/0065855 A1 * | 3/2009 | Bhalla et al. | 257/328 |
| 2009/0085074 A1 * | 4/2009 | Su et al. | 257/288 |
| 2009/0111231 A1 * | 4/2009 | Grebs et al. | 438/270 |
| 2009/0242973 A1 * | 10/2009 | Hebert et al. | 257/330 |
| 2009/0315104 A1 * | 12/2009 | Hsieh | 257/330 |
| 2010/0009543 A1 * | 1/2010 | Cho | 438/735 |
| 2010/0052044 A1 * | 3/2010 | Hirler | 257/328 |
| 2010/0102871 A1 * | 4/2010 | Werner | 327/534 |
| 2010/0129983 A1 * | 5/2010 | Park | 438/435 |
| 2011/0006390 A1 * | 1/2011 | Huang et al. | 257/510 |
| 2011/0037120 A1 * | 2/2011 | Chen et al. | 257/331 |
| 2011/0039383 A1 * | 2/2011 | Chen et al. | 438/270 |
| 2011/0121387 A1 * | 5/2011 | Hebert et al. | 257/334 |

(Continued)

*Primary Examiner* — Matthew Landau
*Assistant Examiner* — Joseph C Nicely
(74) *Attorney, Agent, or Firm* — Joshua D. Isenberg

(57) ABSTRACT

Transistor devices can be fabricated with an integrated diode using a self-alignment. The device includes a doped semiconductor substrate having one or more electrically insulated gate electrodes formed in trenches in the substrate. One or more body regions are formed in a top portion of the substrate proximate each gate trench. One or more source regions are formed in a self-aligned fashion in a top portion of the body regions proximate each gate trench. One or more thick insulator portions are formed over the gate electrodes on a top surface of the substrate with spaces between adjacent thick insulator portions. A metal is formed on top of the substrate over the thick insulator portions. The metal forms a self-aligned contact to the substrate through the spaces between the thick insulator portions. An integrated diode is formed under the self-aligned contact.

14 Claims, 30 Drawing Sheets

(56) References Cited

U.S. PATENT DOCUMENTS

| | | | |
|---|---|---|---|
| 2011/0136310 A1* | 6/2011 | Grivna | 438/270 |
| 2011/0220990 A1* | 9/2011 | Chang et al. | 257/330 |
| 2012/0129327 A1* | 5/2012 | Lee | 438/548 |
| 2012/0205737 A1* | 8/2012 | Chen et al. | 257/331 |
| 2012/0280307 A1* | 11/2012 | Su et al. | 257/328 |
| 2012/0329225 A1* | 12/2012 | Bhalla et al. | 438/270 |

* cited by examiner

US 8,580,667 B2

SELF ALIGNED TRENCH MOSFET WITH INTEGRATED DIODE

FIELD OF THE INVENTION

This invention generally relates to trench MOSFET devices and more particularly to the methods for fabricating self aligned trench MOSFET devices with integrated Schottky diode.

BACKGROUND OF THE INVENTION

Many electronic circuit designs today have strict requirements on device performance parameters such as switching performance and on-state resistance. Trench power Metal Oxide Semiconductor Field Effect Transistors (MOSFET) devices are often used in such circuits. Existing fabrication techniques for trench MOSFETs are typically complex and expensive, usually requiring 6 or more masks to be applied during processing.

FIG. 1 is a cross-sectional view of the conventional trench MOSFET device 100. As shown in FIG. 1, trenches 102 are formed in the semiconductor wafer 104 that includes a silicon substrate. By way of example, the silicon substrate may include an epitaxial (epi) layer 108 formed on a heavily doped bottom substrate layer (not shown). Body regions 106 are formed in a top portion of epi layer 108. Source regions 110 are formed on the top portion of the body regions 106. Gate electrodes 101 are formed in the trenches 102 by filling the trenches with polysilicon. The gate electrodes 101 are insulated from the silicon by an oxide layer 114. A metal 112 is formed on top of the wafer 104. In this device, the tops of gate electrodes 101 are recessed below a top surface of the source regions 110, which requires deep junctions, large source contact area (potentially smaller mesa) and the is not compatible with trench-contact (i.e., trench contact to source and body regions), due to alignment issues.

FIG. 2 is a cross-sectional view of another conventional trench MOSFET device 200. The structure of the device 200 is similar to the device 100, which includes trenches 202 formed in the semiconductor wafer 204 containing a silicon substrate. By way of example, the silicon substrate may include an epitaxial (epi) layer 208 formed on a heavily doped bottom substrate layer (not shown). Body regions 206 are formed in a top portion of epi layer 208. Source regions 210 are formed on the top portion of the body regions 206. Gate electrodes 201 formed in the trenches 202 are polysilicon stick up (PSU) type with oxide 214 for insulating from the silicon wafer 204. Adjacent to the tops of the PSU gate electrodes 201 are oxide spacers 207 formed on the top surface of the semiconductor wafer 204. A metal 212 is formed on top of the wafer 204. In this device, the gate electrodes 201 are extended above a top surface of the source regions 210. This type of device has shallow junctions, bigger cell pitch, e.g., about 0.2 micron to 0.3 micron because of the oxide spacers 207, but is trench-contact compatible. However, this raises process control issues, such as controlling the thickness and integrity of the thin oxide between the top corner of the gate electrode 201 and the metal 212.

FIG. 3 is a cross-sectional view of another conventional trench MOSFET device 300. As shown in FIG. 3, gate trench 302 and contact trench 303 are formed in a semiconductor wafer 304 containing a semiconductor substrate which may include an epitaxial (epi) layer 308 formed on a heavily doped bottom substrate layer (not shown). Body regions 306 are formed at a top portion of the epitaxial layer 308. Source regions 310 are formed at a top portion of the body regions 306. A metal 312 is formed on top of the wafer 304. The gate electrode 301 is insulated from the silicon wafer 304 and the metal 312 with an oxide layer 314. However, the gate trench 302 and the contact trench 303 are initially delineated in a single step using a same mask; therefore extra masks are used to protect contact or gate trench in subsequent processes to differentiate the contact trench and the gate trench. Such a process avoids alignment issues, but requires an extra mask compared to self-aligned methods of forming the contact trench. Such a process is disclosed in U.S. Pat. No. 7,767,526, as will be later explained. The disclosures of U.S. Pat. No. 7,767,526 are incorporated herein by reference.

U.S. Pat. No. 6,916,745 discloses a method of forming a trench MOSFET having self-aligned features comprising. In this method, a portion of the silicon layer is removed to form a middle section of a trench and the outer sections of the trench extending into the silicon layer from the exposed surface area of the silicon layer. The middle section of the trench is extending deeper into the silicon layer than the outer sections of the trench. A gate electrode is formed by filling the trench with polysilicon and etching back the polysilicon so that the polysilicon partially fills the trench to below the outer sections of the trench.

U.S. Pat. No. 5,801,417 discloses a recessed gate power MOSFET formed on a substrate including a P-body layer, N-drain layer and optional P+ layer for IGBT. First, a trenching protective layer formed on the substrate is patterned to define exposed areas as stripes or a matrix, and protected areas. Sidewall spacers of predetermined thickness with inner surfaces contact the protective layer sidewalls. A first trench is formed in substrate areas with sidewalls aligned to the sidewall spacer outer surfaces and extending depthwise through the P-body layer to at least a predetermined depth. Gate oxide is formed on the trench walls and gate polysilicon refills the trench to a level near substrate upper surface. Oxide between sidewall spacers covers polysilicon. Then the protective layer exposing upper substrate surface between spacer inner surfaces is removed. This area is doped to form a source layer atop the body layer and then trenched to form a second trench having sidewalls aligned to the spacer inner surfaces. Second trench defines vertically-oriented source and body layers stacked along gate oxide layer to form vertical channels on opposite sides of second trench. Source and body layers have a lateral thickness established by the predetermined spacing of the inner and outer surfaces of the sidewall spacers. Source conductor in the second trench contacts the N-source and P-body layers, and an enhanced P+ region at the base of the second trench.

U.S. Pat. No. 7,390,717 discloses a fabrication process for a trench type power semiconductor device includes forming inside spacers over a semiconductor surface. Using the spacers as masks, trenches with gates are formed in the semiconductor body. After removing the spacers, source implants are formed in the semiconductor body along the trench edges and are then driven. Insulation caps are then formed over the trenches. Outside spacers are next formed along the sides of the caps. Using these spacers as masks, the semiconductor surface is etched and high conductivity contact regions formed. The outside spacers are then removed and source and drain contacts formed. Alternatively, the source implants are not driven. Rather, prior to outside spacer formation a second source implant is performed. The outside spacers are then formed, portions of the second source implant etched, any remaining source implant driven, and the contact regions formed. The gate electrodes are either recessed below or extend above the semiconductor surface.

U.S. Pat. No. 7,767,526 of Alpha & Omega Semiconductor Incorporated discloses a fabrication process for trench gate MOSFET devices using composite masking, which includes a single mask to pre-define gate trenches and body contact trenches. First an initial hard mask layer (e.g. oxide) is formed and patterned on a surface of a semiconductor substrate for a single trench etch to predefine locations for a body contact trench and a gate trench. The predefined trenches are simultaneously etched into the substrate to a first predetermined depth. A gate trench mask is next applied on top of the hard mask. The gate trench mask covers the body contact trenches and has openings at the gate trenches. The gate trench, but not the body contact trench, is etched to a second predetermined depth, with the other regions covered by a combination of the initial hard mask and the gate trench mask.

US patent publication number 20090242973 of Alpha & Omega Semiconductor, LTD discloses a method for manufacturing a vertical power MOSFET device using technique an oxide cap with a conductive polysilicon spacer. The method includes forming a trench with a predetermined depth in the N-epi layer, forming a gate electrode in the trench, implanting and diffusing dopants into a top region of the N-epi layer to form a P-body layer and source region, forming oxide on top of the gate electrode and the source region, etching portions of the oxide to expose selected portions of the source region, etching selected portions of the source region not covered by the oxide down to the p-body layer, and forming N+ doped polysilicon spacers disposed along the sidewalls of the remaining portions of the source region and the oxide. The N+ doped polysilicon spacers increase the contact area to the source region.

US patent publication number 20100032751 of ALPHA AND OMEGA SEMICONDUCTOR INCORPORATED discloses a method for manufacturing a vertical power MOSFET device using technique of poly stick up (PSU) with spacers. The method includes forming a trench in the epitaxial layer (which may include a body region), forming a gate electrode in the trench with a gate oxide disposed between the gate electrode and the epitaxial layer, forming a cap insulator over the gate electrode and etching back around the cap insulator such that the top of the gate electrode is even with or protrudes above a surface of the epitaxial layer, forming a polysilicon spacer on the epitaxial layer self-aligned to the cap insulator, diffusing at least a portion of the dopants of the polysilicon spacer into the body layer to form a source region below the polysilicon spacer, and implanting a body contact region in the body, which is self-aligned to the polysilicon spacer.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention include methods of fabricating a self aligned trench transistors (e.g., trench MOSFETs) with an integrated Schottky diode using very few photoresist masks.

Figure 1:
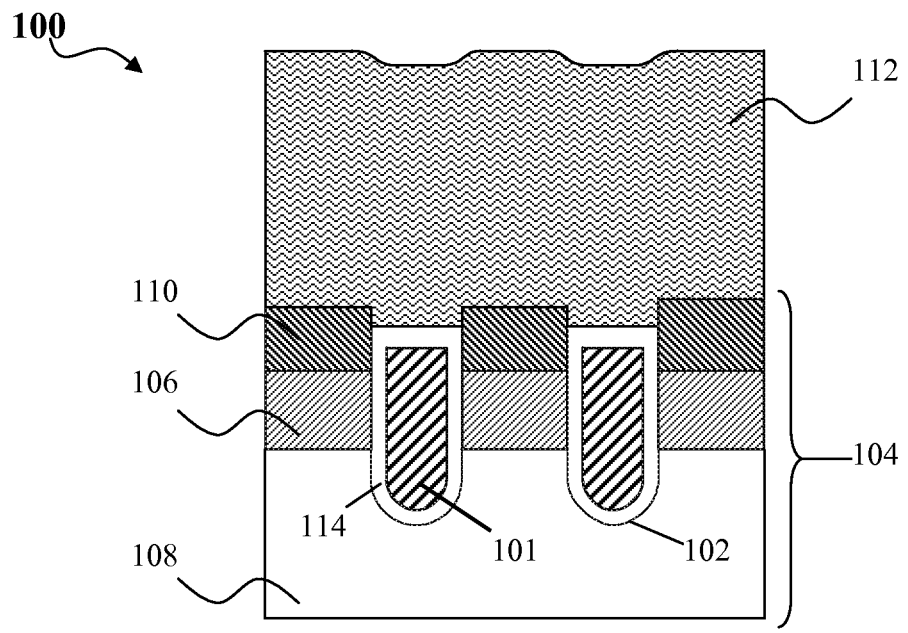
FIG. 1 is a cross-sectional diagram illustrating a conventional deep poly recess trench MOSFET.
Figure 2:
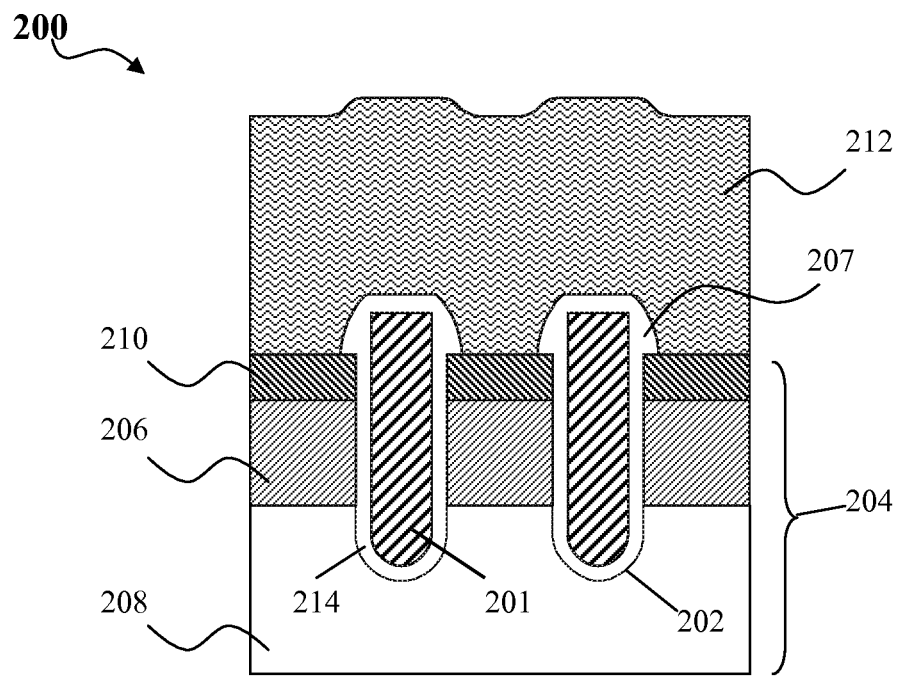
FIG. 2 is a cross-sectional diagram illustrating a conventional poly stick up (PSU) trench MOSFET.
Figure 3:
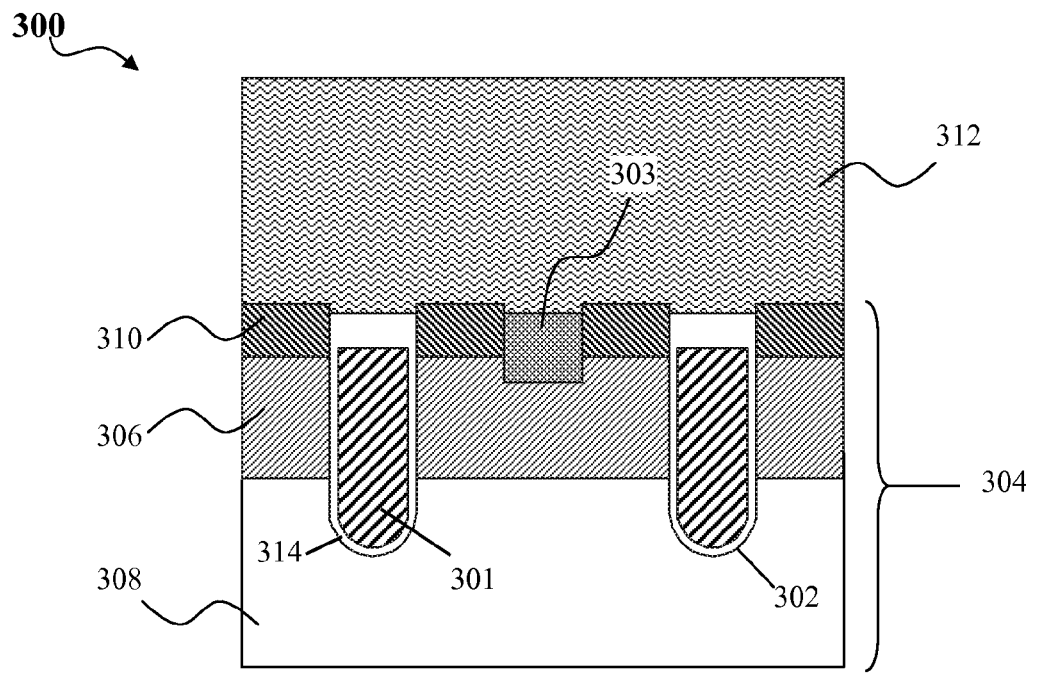
FIG. 3 is a cross sectional diagram illustrating a conventional composite masking trench MOSFET.
Figure 4:
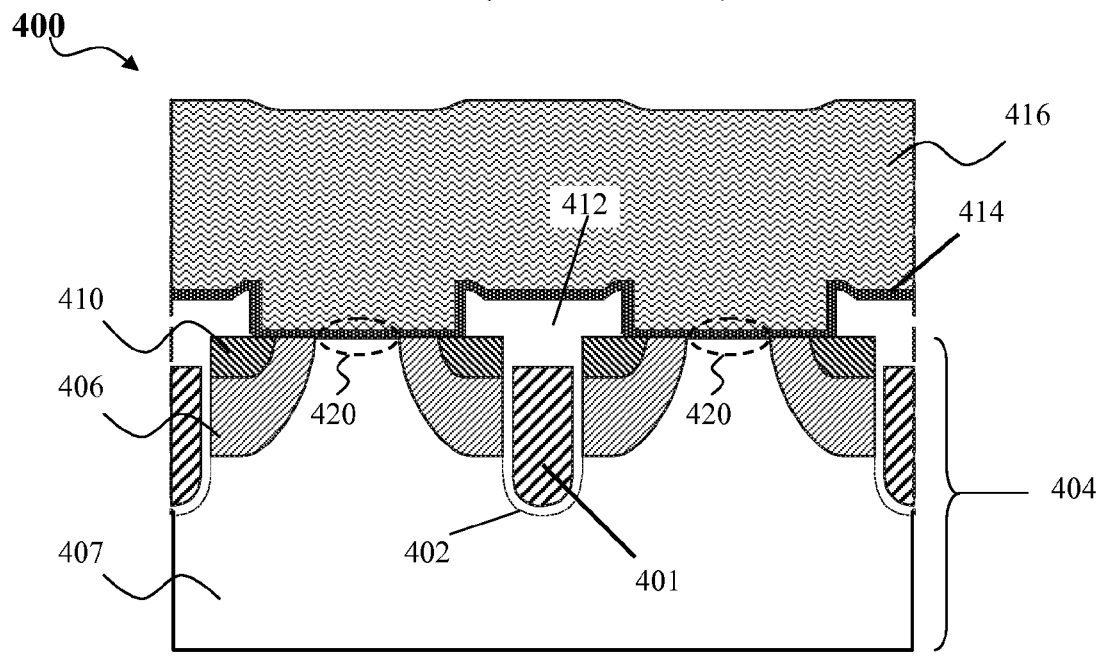
FIG. 4 is a cross sectional diagram illustrating a self aligned trench MOSFET with integrated Schottky diode according to an embodiment of the present invention.

FIG. 4 is a diagram illustrating a top view of self aligned trench MOSFET device 400 with an integrated Schottky diode according to an embodiment of the present invention. As shown in FIG. 4, gate trenches 402 are formed in the semiconductor wafer 404 containing a semiconductor substrate which may include an epitaxial (epi) layer 407 formed on a suitably doped lower semiconductor substrate layer (not shown), e.g., an N-type silicon substrate for an N-channel device or P-type silicon for a P-channel device. Separated body regions 406 are formed in a top portion of the epi layer 407 proximate each gate trench 402. Source regions 410 are formed in a self-aligned fashion in a top portion of the body regions 406. A metal 416 is formed on top of the wafer 404 with a conductive diffusion barrier 414, e.g. barrier metal, located between the metal 416 and the wafer 404. The gate electrode 401 is formed in the trench 402 and is insulated from the silicon wafer 404 and the diffusion barrier 414 by thick insulator portions 412 that protrude above the surface of the wafer 404. The gate electrode 401 is recessed below a top surface of the wafer 404 and is electrically insulated from the metal 416 by the thick insulator (e.g., oxide) portions 412, which are formed over the gate electrodes 401 on the top surface of the wafer 404. The metal 416 can electrically contact the body regions 406 and source regions 410 through spaces between the thick insulator portions 412.

The metal 416 preferably includes Aluminum (Al). The diffusion barrier 414 preferably includes Ti/TiN to form a Schottky barrier diode with the silicon. Schottky diode regions 420 are formed at the metal-semiconductor junction between adjacent body regions 406, where the metal contacts the lightly doped epi layer 407. During normal operation, the device is normally biased such that the Schottky diode is reversed biased.

Figure 5A:
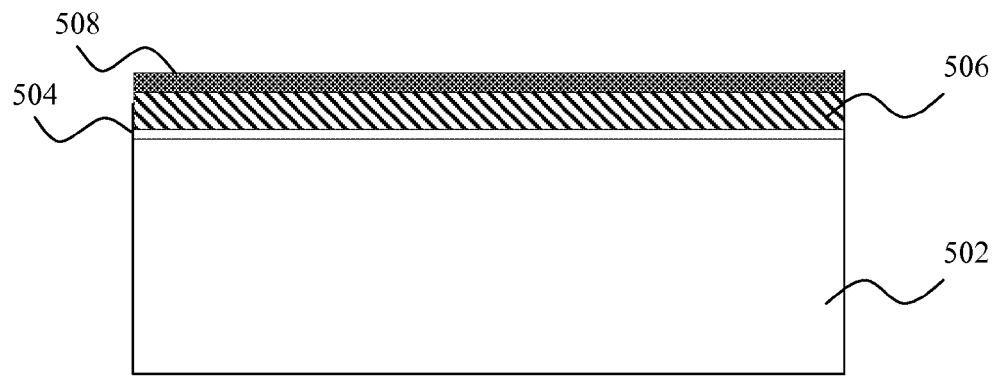
FIGS. 5A-5L are cross sectional diagrams illustrating the steps of fabrication the self aligned trench MOSFET of the type depicted in FIG. 4.

A fabrication process of the self aligned trench MOSFET with integrated Schottky diode of the type depicted in FIG. 4 with four masks is discussed in FIGS. 5A-5L. As shown in FIG. 5A, an N type substrate 502 (e.g., an N type silicon wafer with an N-type epi layer grown on it for an N-channel device or a P type silicon wafer with a P-type epi layer grown in it for a P-channel device) may be used as the drain of the device. A thin oxide layer 504 can be formed on the substrate by deposition or thermal oxidation. An un-doped polysilicon (or poly) layer 506 is deposited on top of the oxide layer 504 and a nitride layer 508 can then be disposed on top of the un-doped poly layer 506. The combination of the thin oxide layer 504, poly layer 506, and nitride layer 508 is sometimes referred to herein as a "sandwich structure" or "hard mask" structure for convenience. The hard mask may also be viewed as a type of sacrificial structure, which is used during the process, and later removed. By way of example, and not by way of limitation, the thickness of the thin oxide layer 504 can be approximately 200 Å to 1000 Å, the thickness of the un-doped poly layer 506 can be approximately 3000 Å to 5000 Å, and the thickness of the nitride layer 508 can be approximately 1000 Å to 3000 Å.

Figure 5B:
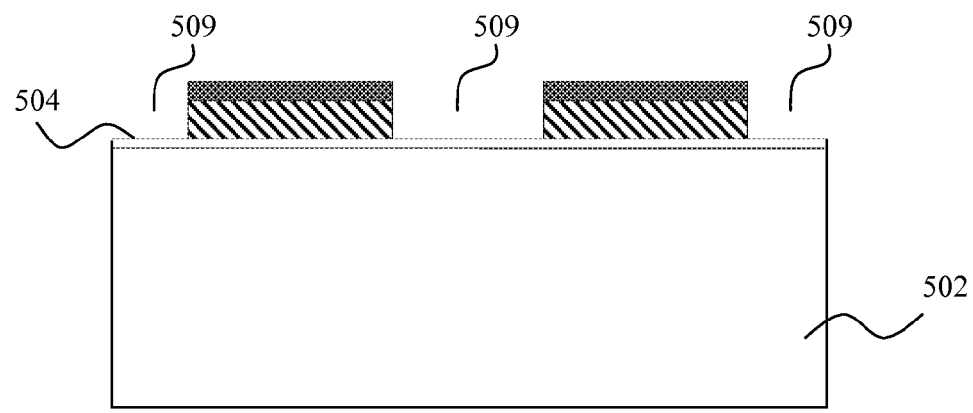

A photo resist (PR) layer (not shown) is then applied on top of the nitride layer 508 and patterned using a trench mask (not shown). The nitride layer 508 and poly layer 506 are thus etched back to form gate trench openings 509 as shown in FIG. 5B.

Figure 5C:
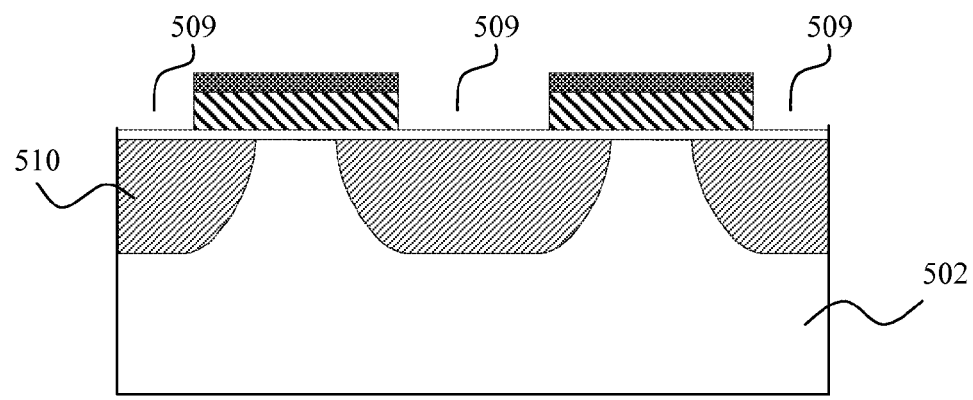

In FIG. 5C, body implant and body diffusion take place. The device is bombarded with dopant ions. In active areas unprotected by nitride 508, e.g. at trench openings 509, the implant forms body regions such as 510. The dopant ions are of the opposite conductivity type to the doping of the substrate 502. In some embodiments, the dopant ions can be Boron ions for an N-channel device. The Boron ions can be implanted at a dosage level of approximately $1.8 \times 10^{13}$ ions/$cm^2$ at an energy of about 60 KeV to about 180 KeV Other types of ions can be used. For example, Phosphorous or Arsenic ions can be used for P-channel devices.

Figure 5D:
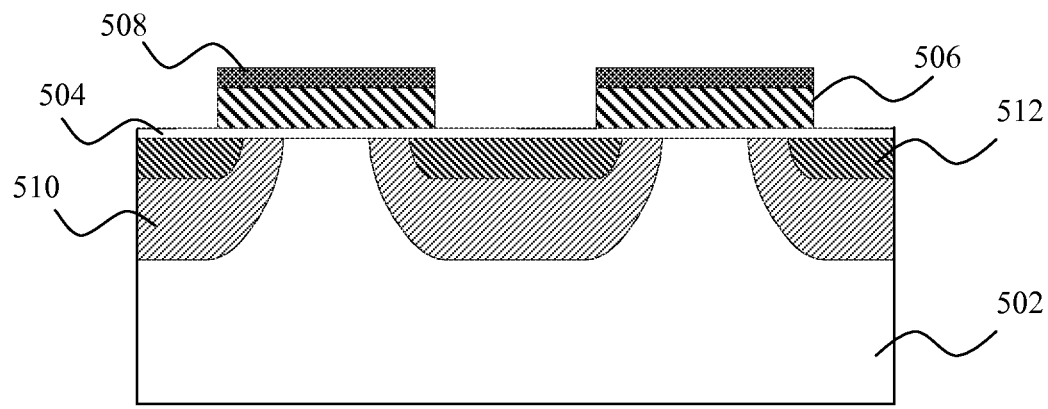
Figure 5E:
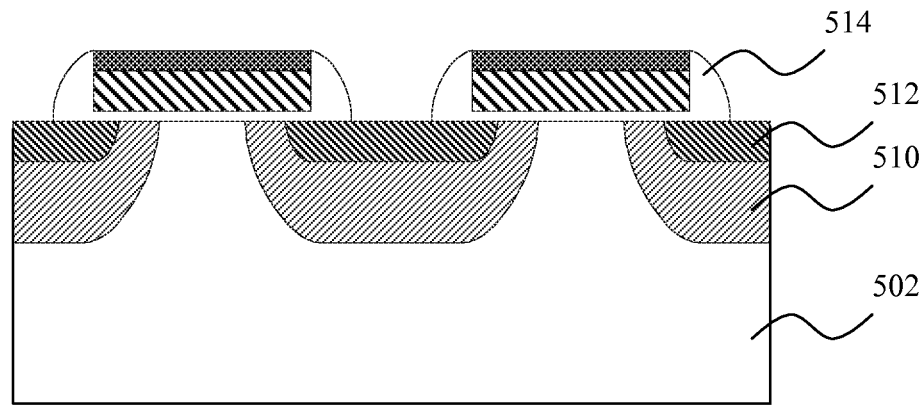

In FIG. 5D, source implant and source diffusion take place. The device is again bombarded with dopant ions. In some embodiments, Arsenic ions can be implanted at a dosage level of about $4 \times 10^{15}$ ions/$cm^2$ and at an implantation energy of about 40 KeV to about 80 KeV can be used to form the source regions for an N-channel device. Alternatively, boron ions can be implanted to form the source region for a P-channel device. Source regions such as 512 are formed within body regions such as 510. No additional mask is required to implant the body and the source of the device because the oxide layer 504 is sufficient thin for the ions to be implanted through it and the remaining portions of the poly layer 506 and nitride layer 508 act as an implant mask. Thus, the body and source implants can be performed as self-aligned blanket implants. Hard mask spacers 514, e.g., made of oxide or nitride can be formed along the sides of the remaining portions of the poly layer 506 and nitride layer 508, e.g., by blanket deposition and etchback, followed by removal of the exposed portion of the thin oxide layer 504 as shown in FIG. 5E.

Figure 5F:
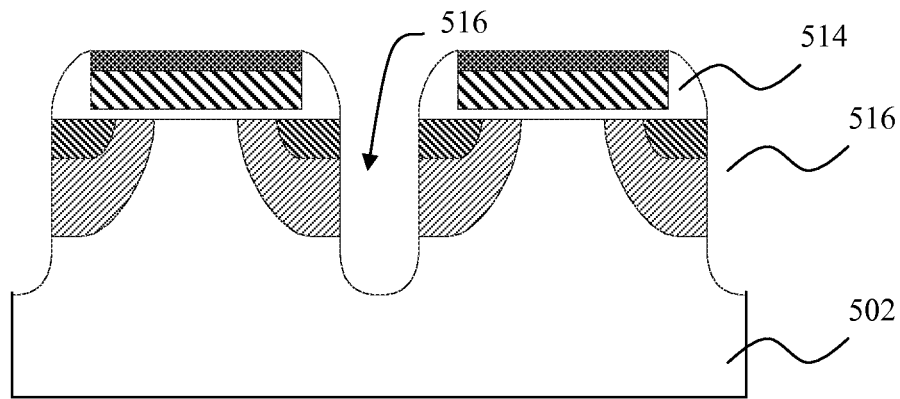

Gate trench 516 is formed by etching back the semiconductor substrate 502 to a predetermined depth with the spacers 514 defining the sidewalls of the trenches 516 as shown in FIG. 5F. The spacers 514 allow for a self-aligned etching step that does not require additional mask.

Figure 5G:
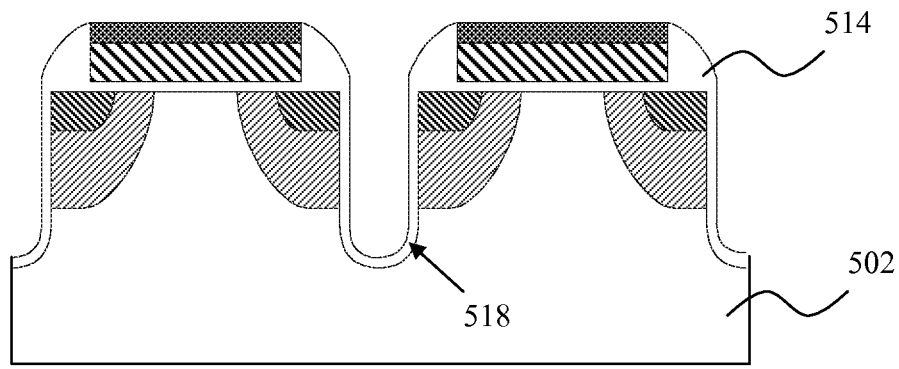
Figure 5H:
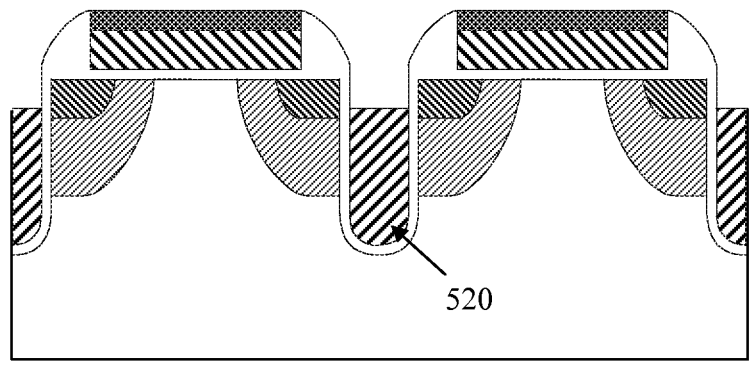

As shown in FIG. 5G, a thin gate oxide 518 is grown on the sidewalls and the bottom of the trench 516. Polysilicon 520 is then deposited into the trench 516 and is etched back below the top surface of the substrate 502 as shown in FIG. 5H.

Figure 5I:
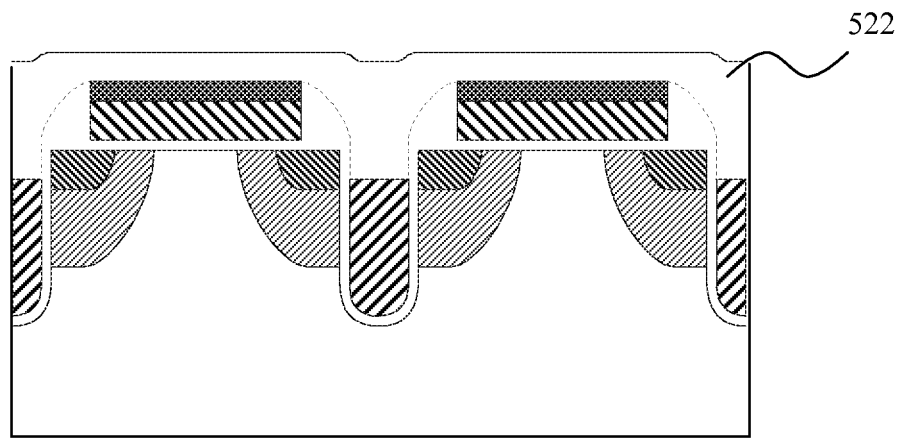

In FIG. 5I, insulator 522, such as an oxide, ranging from 5000 Å~8000 Å in thickness can be deposited to fill trench openings and cover source and gate poly regions, followed by a reflow to planarize the surface of the insulator layer 522. In some embodiments, a chemical vapor deposition (CVD) process is used to deposit Low Temperature Oxide (LTO) and Boron Phosphorus Silicate Glass (BPSG) to a thickness of approximately 5000 Å.

Figure 5J:
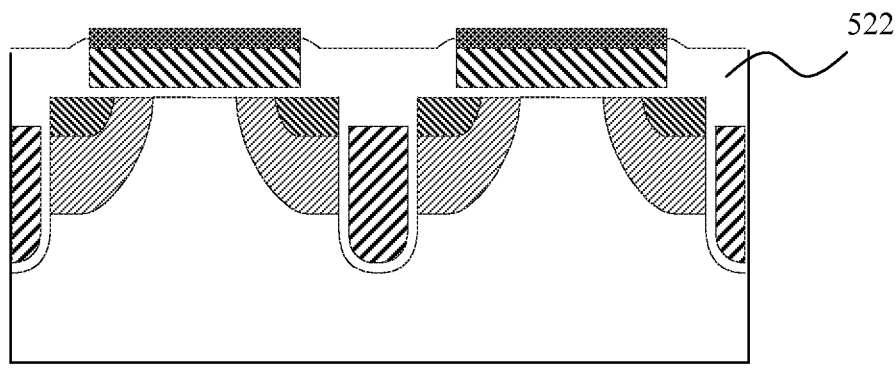
Figure 5K:
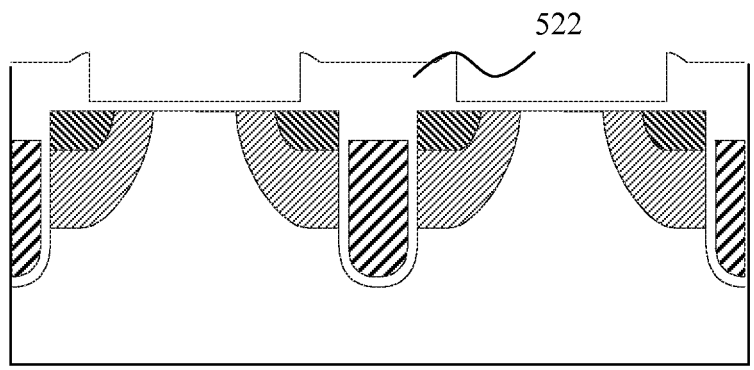

In FIG. 5J, the insulator 522 is etched back through a dry etch process where the oxide is etched down and stopped by endpoint below the top surface of the nitride layer 508. Nitride layer 508, poly layer 506 are etched away as shown in FIG. 5K. The remaining portions of the oxide layer 504 is also etched away with a light oxide etch to form a source/body contact. The light oxide etch is only performed for a short period of time to remove the thin oxide layer 504 while keeping the much thicker insulator layer 522 intact without needing a mask. Thus the nitride layer 508, poly layer 506, and oxide layer 504 serve as a sort of sacrificial structure.

Figure 5L:
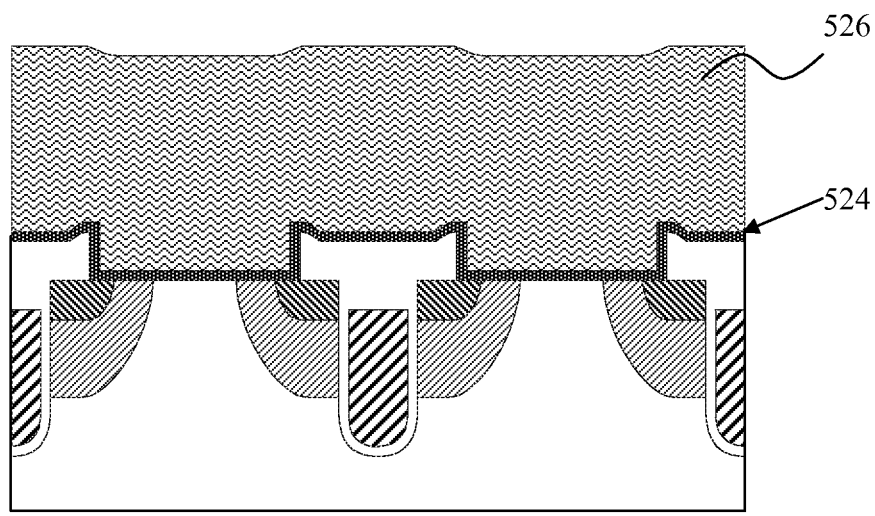

A barrier metal 524, preferably made of Ti/TiN, is deposited on top of the insulator layer 522 and on the exposed surface of substrate 502. A layer of metal 526, preferably made of Al approximately 3 μm~6 μm thick, can be deposited on top of the structure. Metal 526 is etched and annealed to form source metal and gate metal (gate metal not shown) using a metal mask to complete the device as shown in FIG. 5L. A back metal (not shown) may also be formed on the back side of the device as a drain metal.

The fabrication process described in FIGS. 5A-5L has a low photo resist mask count and low process complexity. The self aligned trench MOSFET cell structure formed with the process in FIGS. 5A-5L has high cell density with the trench contact being compatible with other embodiments of the current invention, which are described below in FIGS. 6A-6B and 7A-7B.

Figure 6A:
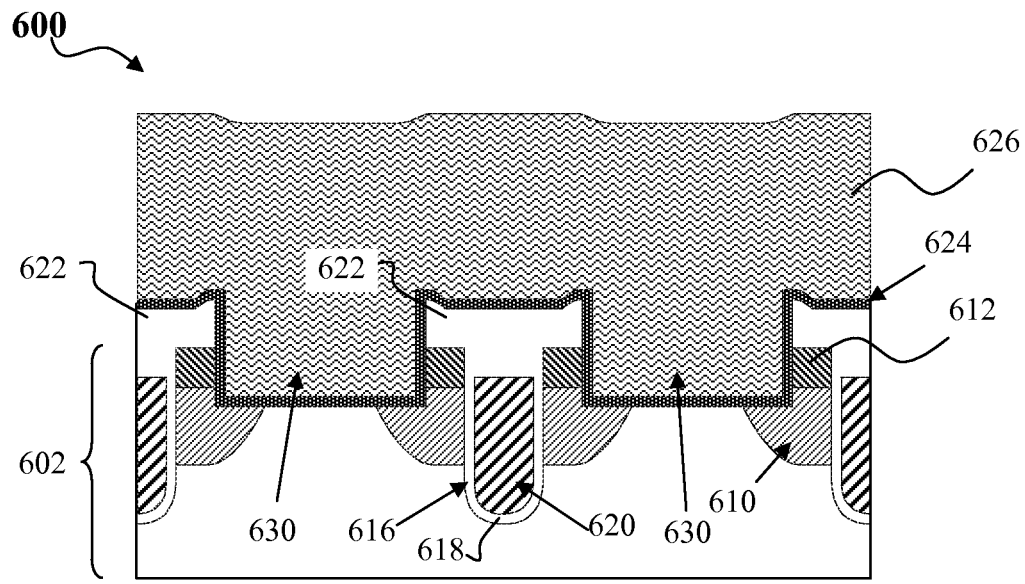
FIGS. 6A-6B are cross sectional diagrams illustrating self aligned trench MOSFETs with integrated Schottky diode according to another embodiment of the present invention.
Figure 6B:
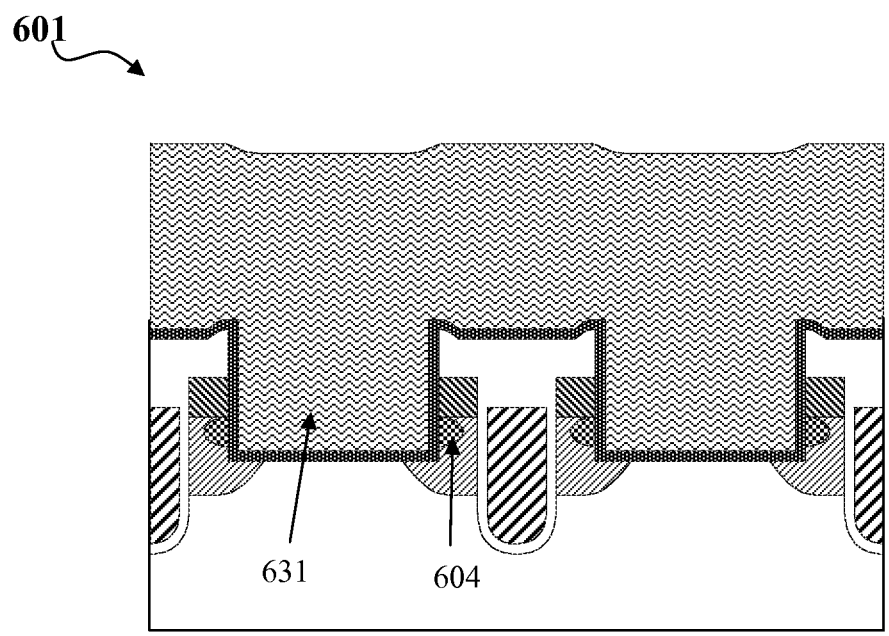

FIGS. 6A-6B are cross-sectional diagrams of an alternative self aligned trench MOSFET with integrated Schottky diode, according to another embodiment of the present invention. The structure of the MOSFET 600 of FIG. 6A is similar to the structure of MOSFET 400 depicted in FIG. 4 or the complete device described in FIG. 5L above. By way of example, the MOSFET 600 may include a gate trench 616 and is formed in a semiconducting substrate 602 (e.g., a semiconductor wafer) containing an N-type epitaxial (epi) layer formed on an N-type silicon bottom substrate layer (e.g. for an N-channel MOSFET). Alternatively, the substrate may have a P-type epi layer formed on a P-type bottom substrate (e.g. for a P-channel MOSFET). A body region 610 is formed on the top portion of the epi layer. The body region is doped with ions of an opposite conductivity type to that of the substrate 602. Source regions 612 are formed on the top portion of the body region 610. A metal 626 is formed on top of the semiconductor wafer 602 with a metal diffusion barrier 624 located between the metal 626 and the wafer 602. The gate electrodes 620 are formed in trenches 616 and are insulated from the silicon wafer 602 and the diffusion barrier 624 with a gate insulator 618 (e.g., a gate oxide) lining the gate trenches 616 and thick insulating portions 622 formed over the gate electrodes 620. The gate electrodes 620 are recessed below a top surface of the semiconductor wafer 602. The main difference between the device 600 and the device 400 is that a trench contact 630 is formed down into the wafer 602 between thick insulator portions 622, with the bottom of the trench contact 630 a little below the top surface of the body region 610. The metal 626 fills the trench contact. The trench contact 630 can make better contact to the source 612 and body regions 610. The trench contact 630 can be formed using a similar process to that detailed in FIGS. 5A-5L; after FIG. 5K, a trench etch is performed into the silicon material 602 for trench contacts 630. This trench etch may use the thick insulating portions 622 as a hard mask for self-alignment of the trench contacts 630. Optionally, spacers may first be formed on the thick insulating portions 622 sidewalls before performing the trench etch to form trench contacts 630. A Schottky contact may be formed at the bottom of the trench contacts 630, between the body regions 610.

The MOSFET 601 of FIG. 6B is similar to the MOSFET 600 except the trench contact 631 is double trench etched down into the wafer 602 with the endpoint stopped at the middle of the body layer 610. In addition, portions 604 of the body region 610 close to the trench contact can be implanted with suitable dopants to provide better contact to the body region 610. By way of example, a first trench etch may be performed as described above to etch a trench to about the depth described in FIG. 6A. An implant may be performed to form a heavily doped body contact region 604 at the bottom of the trench. A diffusion step may spread the body contact regions 604 to the sides of the trench. Next, a second trench etch may be performed to deepen the trench contact through so that only the side portions of the body contact regions 604 remain. This allows for a Schottky contact to be formed at the bottom of the contact trenches 631, between the body regions 610.

Figure 7A:
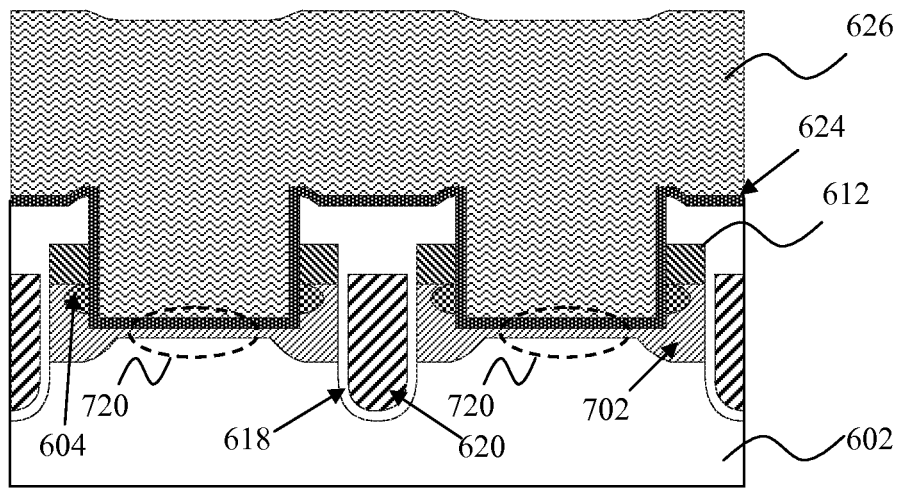
FIGS. 7A-7B are cross sectional diagrams illustrating self aligned trench MOSFETs with integrated Schottky diode according to another embodiment of the present invention.
Figure 7B:
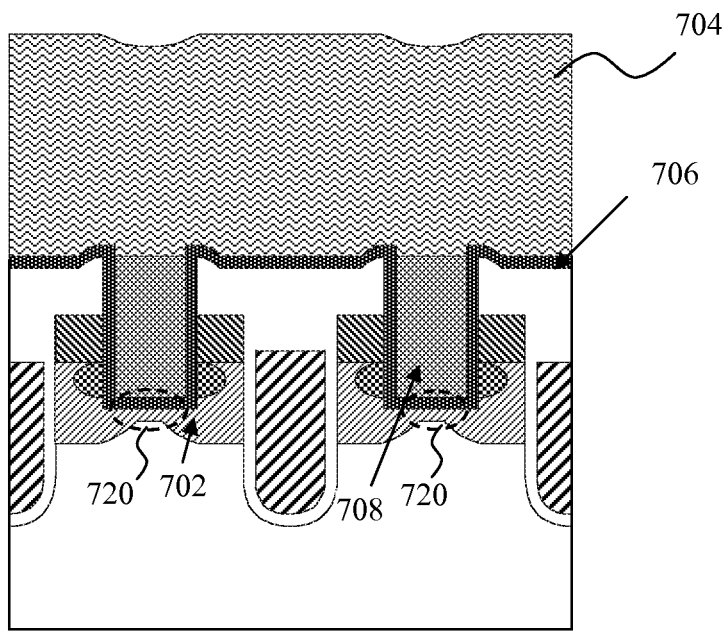

FIGS. 7A-7B are cross-sectional diagrams of the self aligned trench MOSFET with a low injection efficiency body diode, according to another embodiment of the present invention. The structure of the device 700 of FIG. 7A is similar to structure of the device 601 depicted in FIG. 6B, except that a thin portion of the body regions 702 extends under the metal diffusion barrier 624 and metal 626 between the gate trenches 620, and between the metal diffusion barrier 624 and the substrate 602. As a result of the lightly doped portions of the body regions 702 under the contact trenches, low injection efficiency P-N junction body diode regions 720 are formed. As a result the self-aligned trench MOSFET includes an integrated low injection efficiency P-N junction body diode. Low injection can be achieved, e.g., with lightly-doped body regions 702 under the contact trenches.

The device 701 of FIG. 7B is similar to the device 700 except that instead of direct contact by the metal 616 via the diffusion barrier 624, a contact trench 708 is filled with a conductive plug, e.g. Tungsten (W), followed with a deposition of metal 704, e.g. aluminum, on top of the diffusion barrier 706 and the conductive plug 708.

In another embodiment of the present invention, a method of making self aligned trench MOSFET with integrated Schottky diode described above can be incorporated into methods of forming shield gate trench MOS devices, examples of which are disclosed, e.g., in U.S. patent application Ser. Nos. 12/583,192 and 12/722,384, the entire contents of which are incorporated herein by reference. By way of example, and not by way of limitation, the cross-section diagrams shown in FIGS. 8A-8X illustrate a fabrication process of a self aligned, shield gate MOSFET with integrated Schottky diode in accordance with an embodiment of the present invention.

Figure 8A:
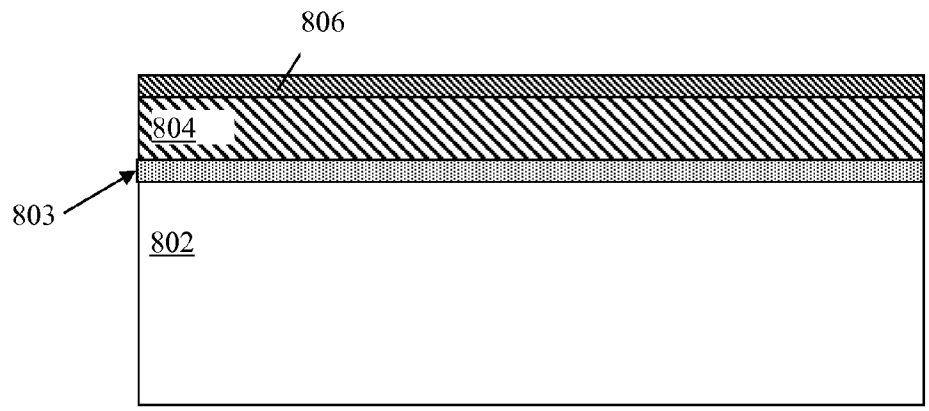
FIGS. 8A-8X are cross sectional diagrams illustrating the steps of fabrication the self aligned shielded gate trench MOSFET with integrated Schottky diode according to another embodiment of the present invention.
Figure 8B:
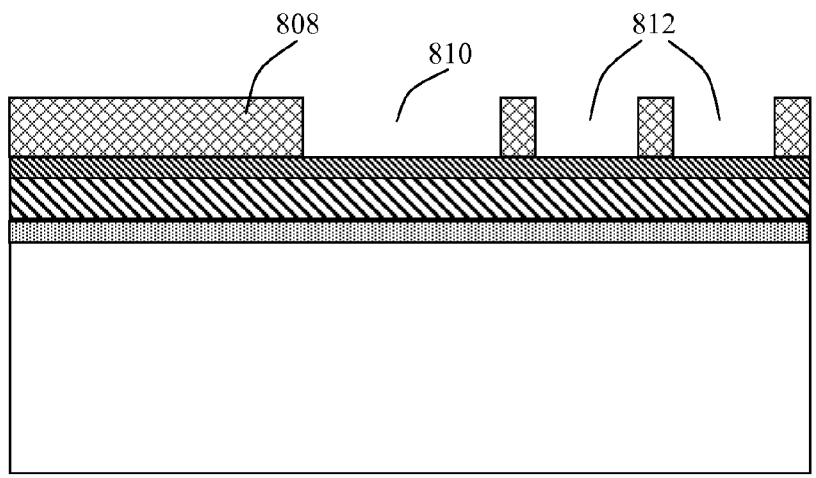
FIGS. 8Y-8Z are cross sectional diagrams illustrating alternative embodiments of the device depicted in FIG. 8X.

As shown in FIG. 8A, a substrate 802 (e.g., an N type silicon bottom substrate layer with a less heavily doped N-type epi layer grown on it or a P type substrate with a P-type epi layer grown on it) is used as the drain of the device. A hard mask sandwich structure can be formed as described above. For example, a thin insulating layer 803 (e.g., oxide) can be formed on the substrate by deposition or thermal oxidation. An un-doped conductive layer 804 (e.g., poly-crystalline silicon (polysilicon or poly)) is deposited on top of the oxide layer 803 and a nitride layer 806 can then be disposed on top of the un-doped conductive layer 804. By way of example, and not by way of limitation, the thickness of the thin oxide layer can be approximately 200 Å to 1000 Å, the thickness of the un-doped poly layer can be approximately 3000 Å to 5000 Å, and the thickness of the nitride layer can be approximately 1000 Å to 3000 Å.

A photo resist (PR) layer 808 is then applied on top of the nitride layer 806 and patterned using a first mask. The residual PR layer 808 forms a termination trench opening 810 and active gate trench openings 812.

Figure 8C:
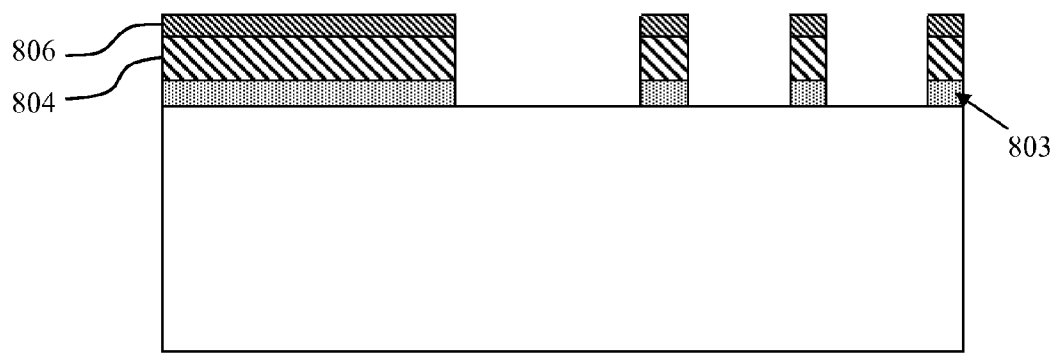

Next, a hard mask (HM) etch is performed to etch away exposed portions of the nitride layer 806 and poly layer 804. The etching of the conductive layer 804 stops at the surface of the thin insulating layer 803; then the thin insulating layer 803 may be etched back to expose the semiconductor substrate 802 surface at the mask openings 810 and 812. The remaining PR 808 is then removed, as shown in FIG. 8C. The remaining portions of thin insulating layer 803, poly layer 804 and nitride layer 806 act as a hard mask for subsequent steps.

Figure 8D:
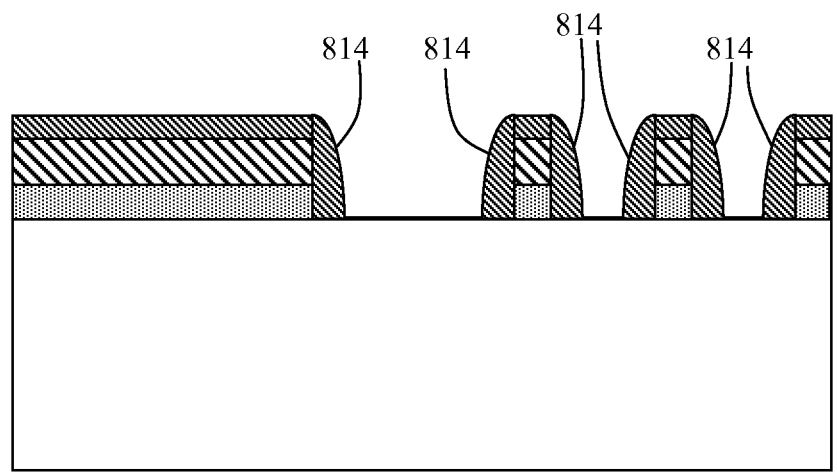

In FIG. 8D, a layer of oxide or nitride is deposited and anisotropically etched back along the horizontal surface. In some embodiments, the thickness of the oxide or nitride layer is approximately 2200 Å. Nitride spacers 814 (sometimes referred to herein as hard mask spacers) are thus formed along the walls of the hard mask openings 810, 812 after blanket anisotropic etch back.

Figure 8E:
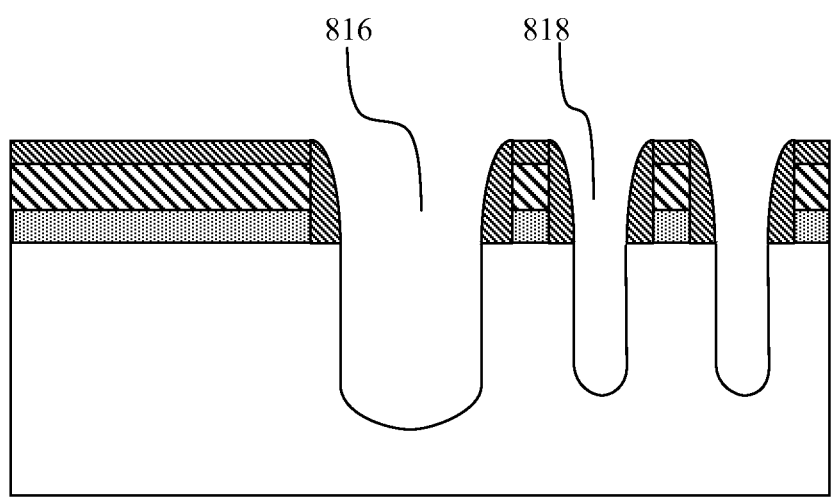

Next, a blanket silicon etch step is performed to form the termination trench 816 and active trenches 814 as shown in FIG. 8E. The resulting trench depth is on the order of approximately 1.5 μm to 2.5 μm depending on device application, and the trench walls may be sloped at an angle of approximately 87° to 88°. The nitride spacers 814 allow for a self-aligned etching step that does not require additional mask. As will be shown later in the process, the nitride spacers preserve a spacing from the original hard mask layers 803, 804 and 806 so that a self-aligned source/body contact trench can be formed. The nitride spacer also performs other benefits such as allowing a polycide to be formed on the gate poly. As used herein and as is generally understood by those skilled in the art of semiconductor fabrication, the term "polycide" refers to a silicide formed over polysilicon. A wider trench opening results in a deeper trench than a narrower trench opening due to the nature of the silicon etch loading factor. For example, since termination trench opening 810 is wider than active gate trench opening 812, the resulting termination trench 816 is etched deeper than active gate trench 818 during the blanket etch step, as shown in FIG. 8E.

Figure 8F:
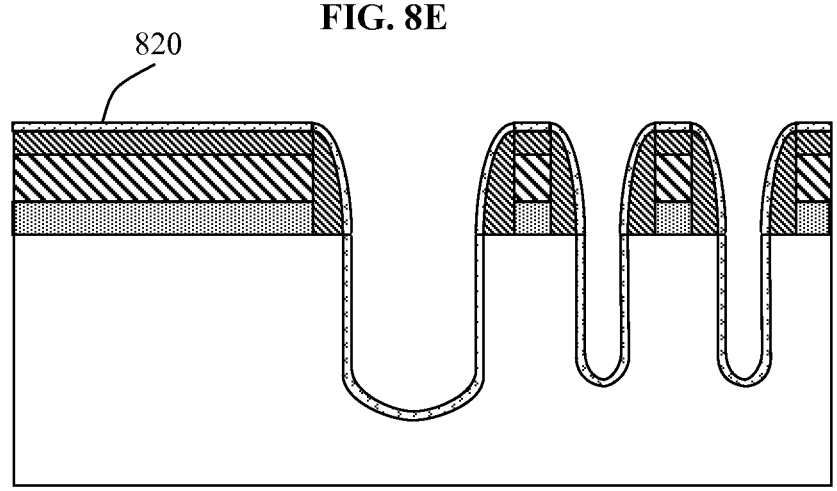
Figure 8G:
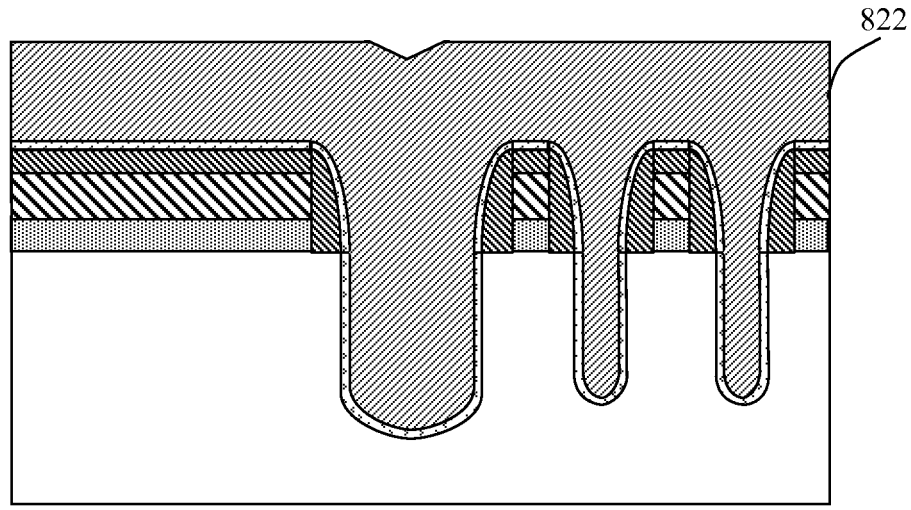

In FIG. 8F, an insulating liner 820 (e.g., an oxide) is deposited or thermally grown on top of the nitride layer 806, on the sidewalls and the bottom of the trenches 816, 818. The liner 820 is thicker than a gate oxide that will be formed later in the process. In some embodiments, a sacrificial oxide layer of approximately 500 Å is optionally grown and removed to improve the silicon surface. By way of example, a layer of oxide of approximately 250 Å is grown, followed by forming a layer of high temperature oxide (HTO) of approximately 900 Å. For a higher voltage device, the oxide liner 820 may be thicker e.g. 1000 to 5000 Å.

Conductive material 822, such as polysilicon (poly) can be deposited, as shown in 8G. In some embodiments, the thickness of the conductive material can be approximately 12000 Å, which is greater than half the width of the widest trench. Thus, conductive material layers on the sidewalls merge and completely fill all the trenches. This layer of conductive material is sometimes referred to as source poly, shield poly, or poly 1.

Figure 8H:
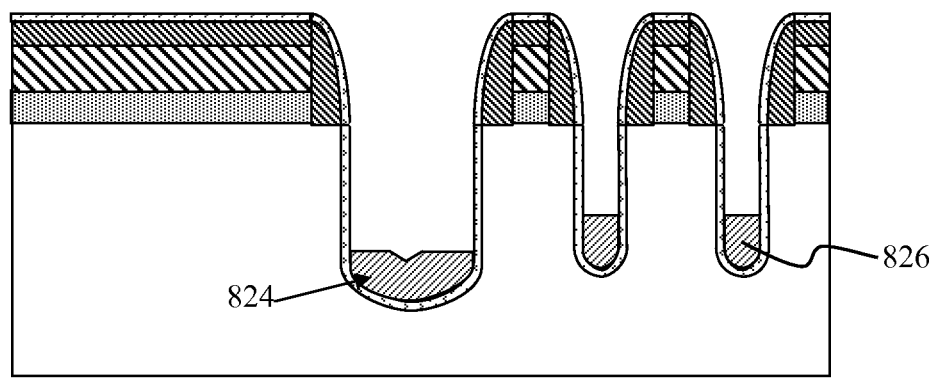
Figure 8I:
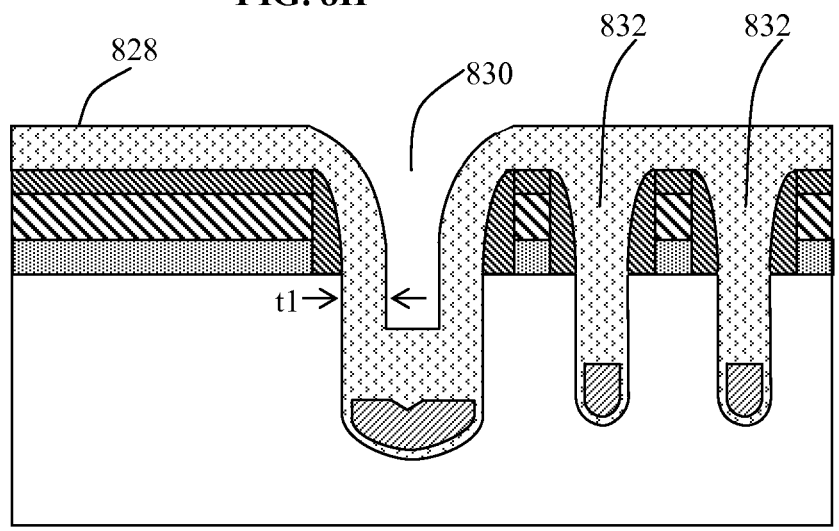

The conductive material 822 is then etched back using a dry etch, as shown in FIG. 8H. In this example, in the active gate trenches, the remaining conductive material 826 has a thickness of approximately 6000 Å, and in the termination trench, the remaining conductive material 824 has a thickness of approximately 3000 Å to 5000 Å.

An inter-polysilicon dielectric/oxide (IPO) 828 can then be deposited and densified. The oxide on the trench sidewalls has a thickness (labeled as t1). In some embodiments, t1 is approximately ranging from about 2000 Å to about 4000 Å to completely fill the narrower trenches (such as active gate trenches and source poly pickup trenches (not shown)), but only partially fill the wider trenches such as the termination trench 830. Thickness t1 should be less than half the width of the wide trenches like termination/gate runner trench 830. Because the wider trenches are not completely filled, a gap remains for a later step. In narrower trenches such as active trenches 832, the thickness of the oxide layer t1 is greater than half the width of the trench, and therefore the oxide linings can merge and completely fill the trench.

Figure 8J:
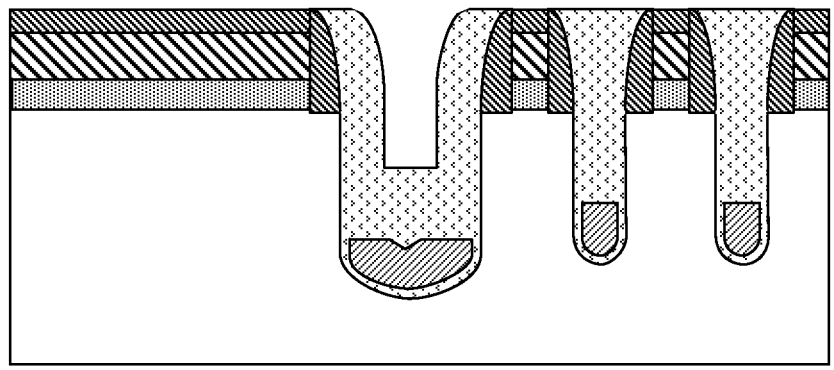

As shown in FIG. 8J, the IPO layer 828 is etched or polished back until the top surface of the oxide 828 is even with the nitride 806 surface, which serves as an etch stop.

Figure 8K:
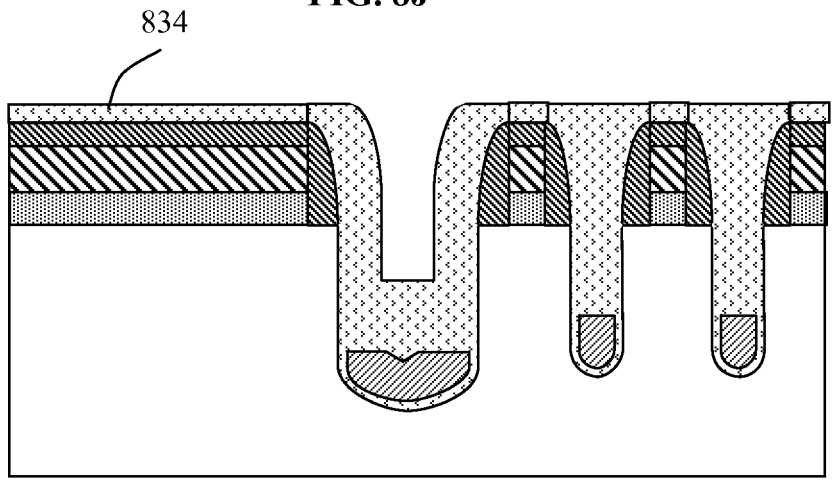

FIG. 8K shows that another layer of insulating material 834 (e.g., an oxide) is formed on the device. The thickness of the insulating layer 834 can be approximately 1000 Å to 2000 Å in some embodiments. The thickness of this oxide controls the degree of undercut of wet etching under the second mask (next step). This oxide film also protects the nitride in all the non-active areas of the device. The protected nitride allows maskless blanket etching of the silicon later.

Figure 8L:
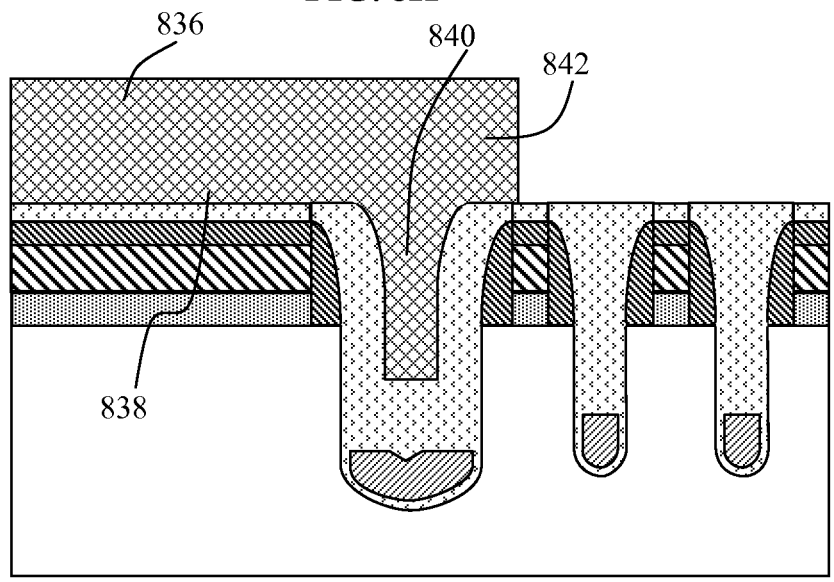
Figure 8M:
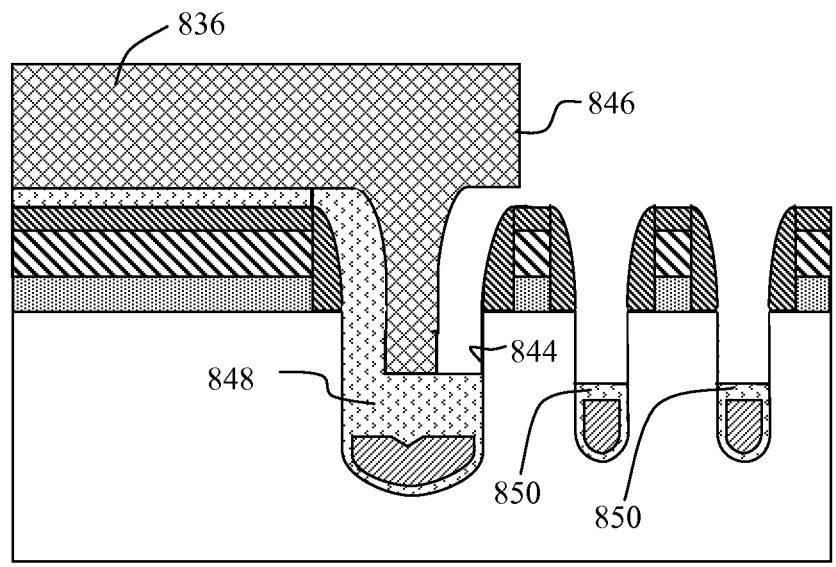

A layer of photo resist 836 is then spun on the surface of the structure and a second mask is applied. FIG. 8L shows the pattern of the PR cover 836 after the exposed portions have been removed. The PR cover extends into termination region at 838, fills termination trench at 840, and slightly extends over into the active area at 842. As will be shown in connection with FIG. 8M, a portion of the oxide under the PR 836 will be removed by etching. Mask overlap and wet etch undercut together help determine the final profile. Thus, the distance of the photoresist cover 836 extending into the active region in part determines in part how much insulating material will be removed by etching. Other factors include etch time and the thickness of the insulating (e.g., oxide) layers. The oxide undercut depth may range from about 0.6 μm to about 1.5 μm.

An isotropic etch (e.g., a wet etch) of the insulating material in layer 834 is then performed. Some insulating material in areas unmasked by the photoresist 836 is removed, such that the remaining material 834 is held at desired height. Some insulating material 834 near the edges of the photoresist 836 is also removed. A portion of oxide along a sidewall 844 of the termination trench, located adjacent to an edge 846 of the photoresist 836 is removed, while leaving the oxide along the other sidewall intact. The amount of insulating material that is etched can be controlled by adjusting the position of edge 846 of the photoresist layer 836 and the etch time. Extending edge 846 further into the active region would result in less material being etched, and pulling the edge away from the active region would have the opposite effect. The amount of oxide etched away can vary in different embodiments. In the example shown, enough oxide is etched away such that the remaining oxide forming inter poly oxide 848 has approximately uniform thickness. A thick layer remains on the side of the termination trench closest to the termination region. The oxide layer above the conductive material in the trenches, such as oxide layers 848 and 850, is also referred to as the inter-electrode dielectric (IED) or inter-poly dielectric (IPD). The insulating material covering the termination region is sometimes referred to herein as the termination protection region. The inter-electrode dielectric can range from about one hundred angstroms to about ten thousand angstroms in thickness.

Figure 8N:
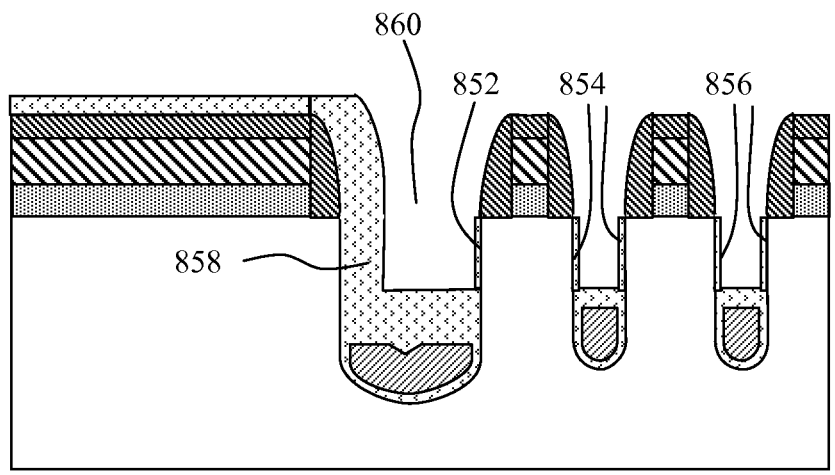

The PR is then removed, and a layer of gate insulator (e.g., gate oxide) can be deposited or thermally grown. In some embodiments, the added oxide layer can be approximately 450 Å thick. Thus, as seen in FIG. 8N, gate insulators 852, 854, and 856 are formed on the exposed trench walls. Termination trench 860 has asymmetric sidewalls, with an insulator 858 on the termination area side, and a thin oxide 852 on the active area side.

Figure 8O:
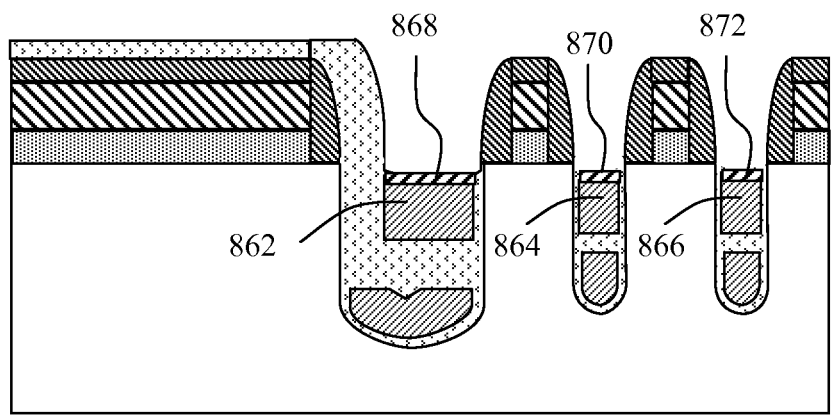

Another conductive material (e.g., polysilicon) deposition and etch back can then be performed, as seen in FIG. 8O. By way of example, and not by way of limitation, approximately 8000 Å to 12000 Å of polysilicon can be deposited in various trenches. The deposited poly can then be etched back, forming gate poly structures, as indicated at 862, 864, 866. In the example shown, the gate poly surface can be recessed approximately 500-1000 Å below the top of the semiconductor substrate. Optionally a layer of metal such as titanium or cobalt can be deposited and annealed to form a gate polycide. Where the metal is in contact with the polysilicon, a polycide layer can be formed. The titanium or cobalt metal deposited over the oxide or nitride does not form silicide or polycide and can be removed by a process that does not remove the polycide. As a result, polycide indicated at 868, 870, 872, is formed on the gate poly structures 862, 864, 866.

Figure 8P:
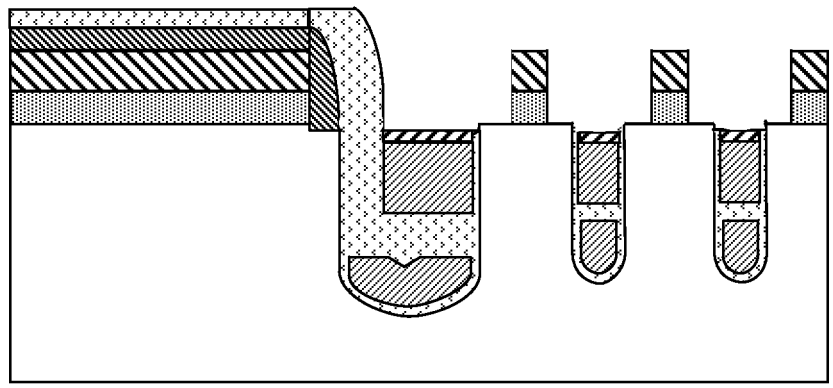

In FIG. 8P, exposed nitride spacers in the termination trench and the active gate trenches as well as other exposed nitride material are removed through a wet etch process. The nitride spacers have protected the hard mask layers 803 and 804 from FIG. 8C up to this point.

Figure 8Q:
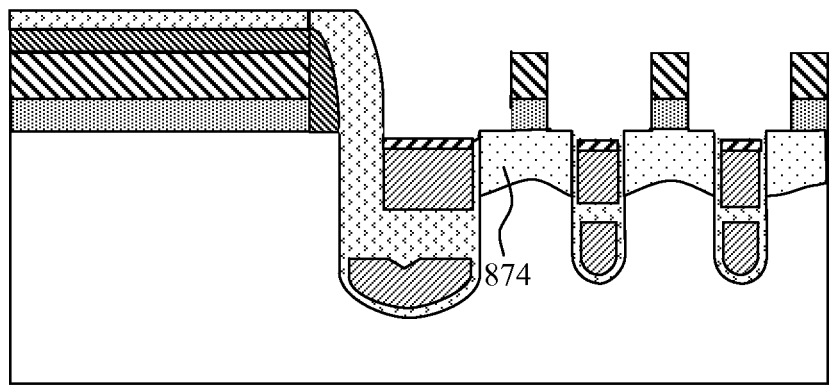

As shown in FIG. 8Q, a body implant can then take place, e.g., by bombarding the partially completed device with dopant ions. The ions may be implanted at an angle. In active areas unprotected by nitride, the implant forms body regions such as 874. In some embodiments, Boron ions with a dosage level of approximately $1.8 \times 10^{13}$ ions/cm$^2$ at 60 KeV~180 KeV are used for an N-channel device. Other types of ions can be used. For example, Phosphorous or Arsenic ions can be used to form the body regions for P-channel devices.

Figure 8R:
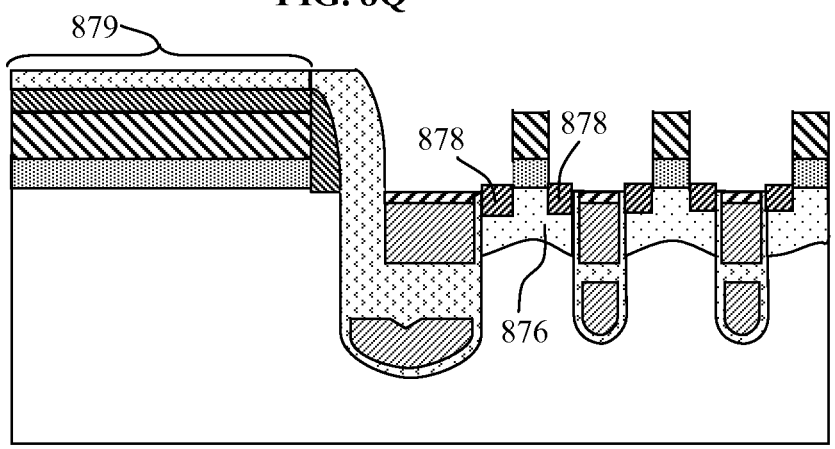

In FIG. 8R, source implant takes place (e.g. with a zero tilt angle (i.e., at normal incidence)). The device is again bombarded with dopant ions. In some embodiments, Arsenic ions with a dosage level of $4 \times 10^{15}$ ions/cm$^2$ at 40 KeV~80 KeV are used. Source regions such as 878 are formed within body regions such as 876. By way of example, a body diffusion step may be performed before the source implant; a source diffusion may then be performed after the source implant.

No additional mask is required to implant the body and the source of the device. The body and source implants can be performed as self-aligned blanket implants. In termination protection regions such as 879, the oxide-polysilicon-nitride-oxide barrier blocks implant ions and prevents source and body regions from being formed in the semiconductor substrate, thus improving device behavior in its off or blocking state.

Figure 8S:
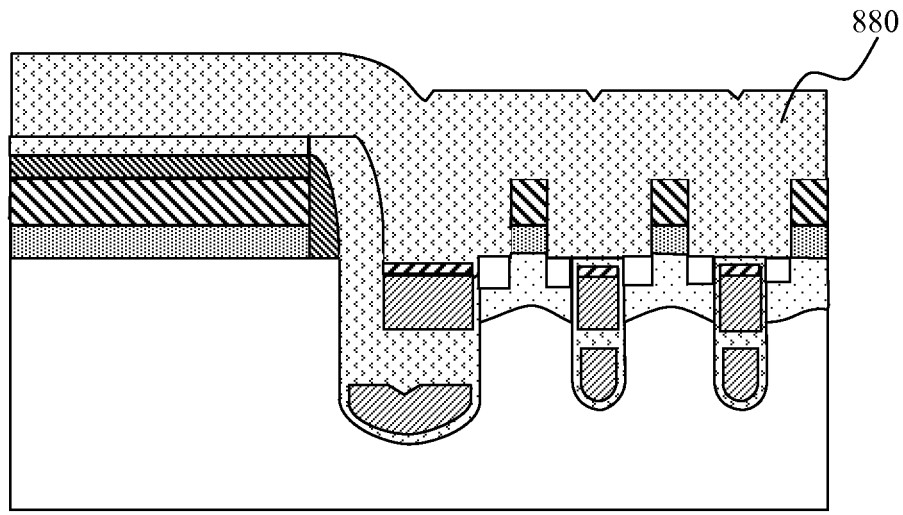

In FIG. 8S, more insulating material 880 (e.g., oxide) ranging from 5000 Å~8000 Å is deposited, filling in the trench openings over the gate poly regions. In some embodiments, a chemical vapor deposition (CVD) process is used to deposit Low Temperature Oxide (LTO) and Borophosphosilicate Glass (BPSG) to a thickness of approximately 5000 Å.

Figure 8T:
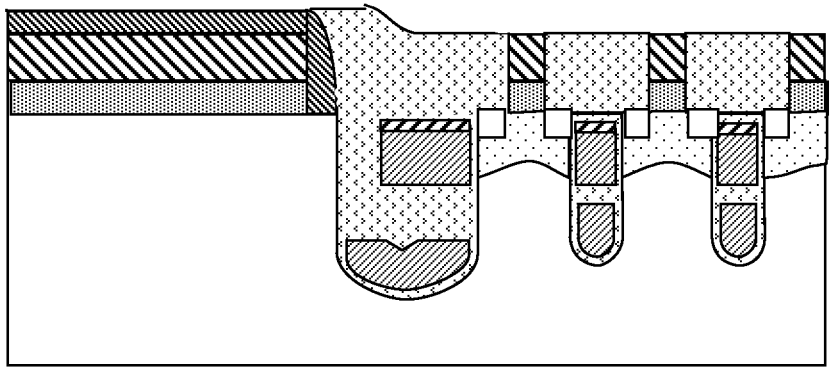

In FIG. 8T, the oxide is etched back through a dry etch process where the oxide is etched down and stopped by endpoint etch to the poly layer 804, which will act as a self-aligned hard mask for the next step.

Figure 8U:
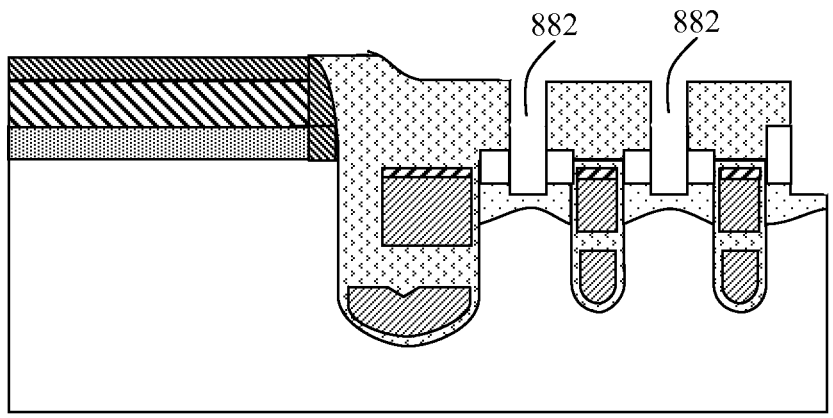

As shown in FIG. 8U, source/body contact trenches 882, also known as active cell contact trenches, are formed in the active cell areas for contact to the source and body regions by etching away remaining poly hard mask 804, through the remaining oxide hard mask 803 (oxide hard mask is relatively thin and can be removed while keeping other oxide regions mostly intact) and then into the silicon substrate. The silicon etch depth may range from about 0.6 μm to about 0.9 μm depending on device applications. Exposed silicon areas are etched, while areas protected by oxide and/or nitride are not etched. Since the etching process does not require an additional mask, it is referred to as a self-aligned contact process. The self-aligned nature of the active cell contact trenches is made possible because the nitride spacers formed near the beginning of the process preserved the hard mask spacing.

Figure 8V:
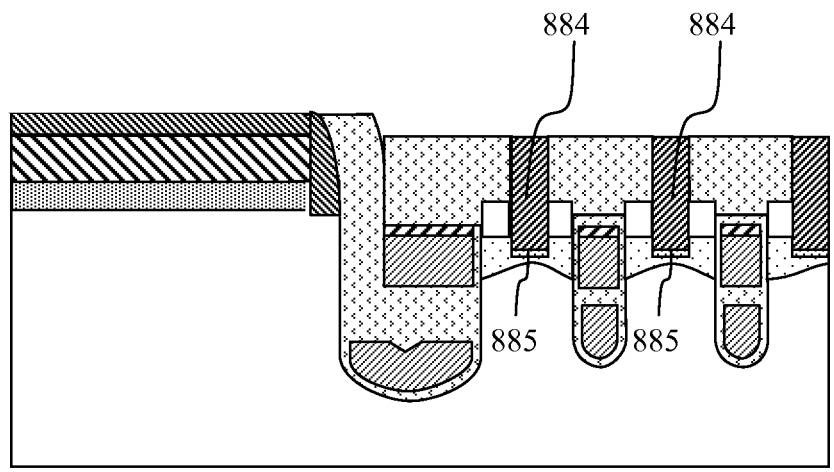

In FIG. 8V, barrier metal such as Ti and TiN are deposited, followed by RTP to form Ti silicide near the contact region. The thicknesses of Ti and TiN used in some embodiments are 300 Å and 1000 Å, respectively. Tungsten (W) is then deposited. In some embodiments about 4000 Å to about 6000 Å of W is deposited. The deposited W is etched back up to the oxide surface to form individual W plugs such as 884. Prior to barrier metal deposition a P+ implant may optionally be performed at the bottom of the contact trenches to form body contact regions 885. In some embodiments, the trench contact 884 could be etched all the way through to reach the portions of the semiconductor substrate 802 below the body regions 876 (e.g. an epi layer portion of the substrate below the body regions) to form an integrated Schottky diode.

Figure 8W:
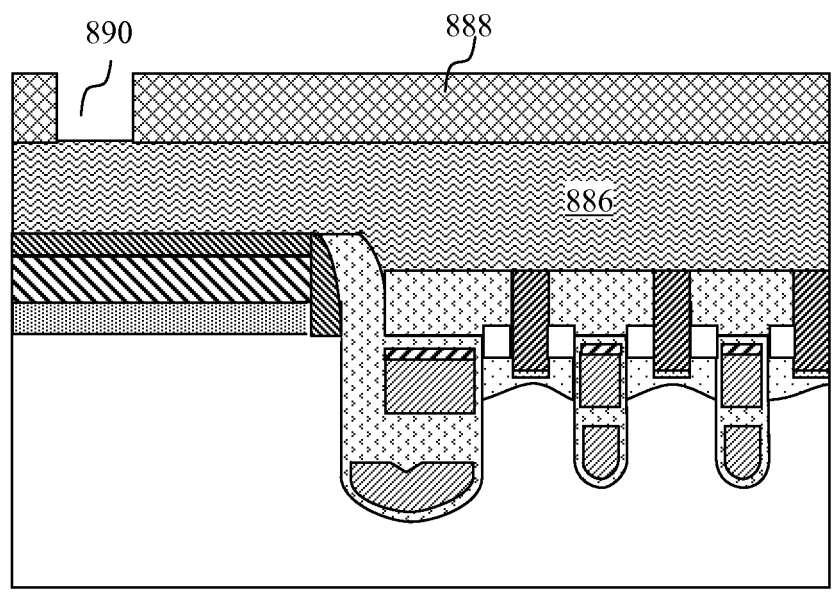
Figure 8X:
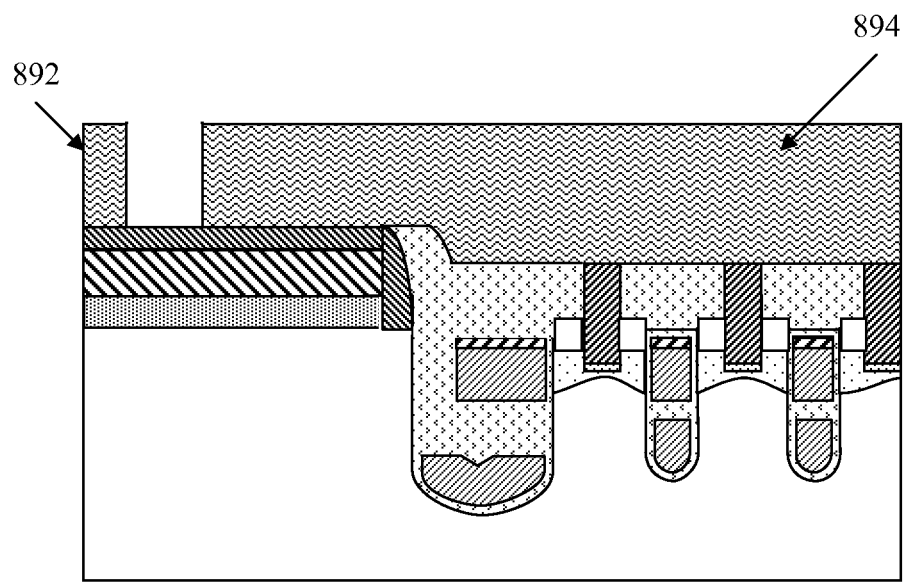

In FIG. 8W, a metal layer 886 is deposited. In some embodiments, Aluminum-Copper (AlCu) can be used to form a metal layer that is approximately 3 μm to about 6 μm thick. A fourth mask can be used to pattern a source metal region and a gate metal region. For example, a photoresist 888 can be deposited and patterned using a metal mask. Metal under openings such as 890 can be etched away in a metal etch process after the photoresist 888 is developed.

The residual photoresist layer 888 can then be removed, and the metal can be annealed. In some embodiments, the metal can be annealed at about 450° C. for about 30 minutes. FIG. 8X is a cross sectional diagram illustrating an example of a completed device with a gate metal 892 and a source metal 894.

Figure 8Y:
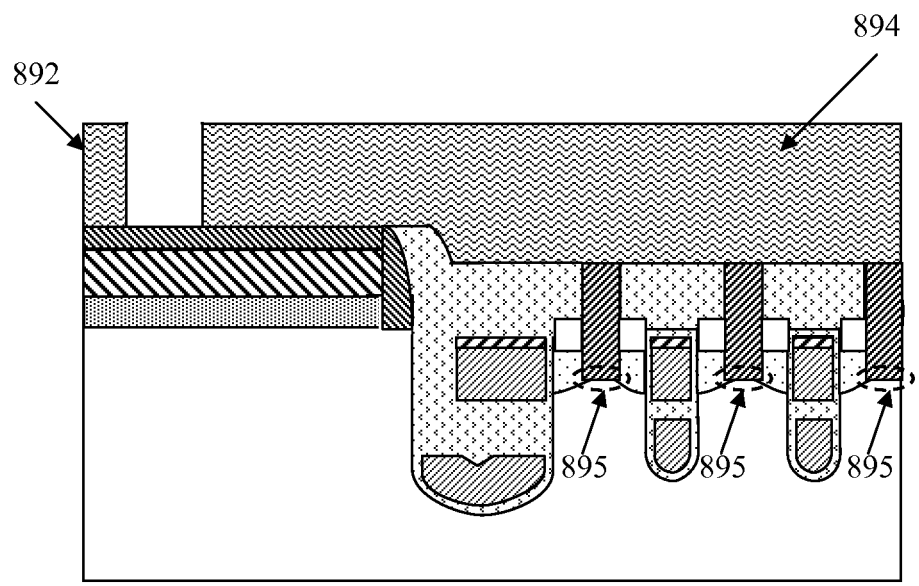
Figure 8Z:
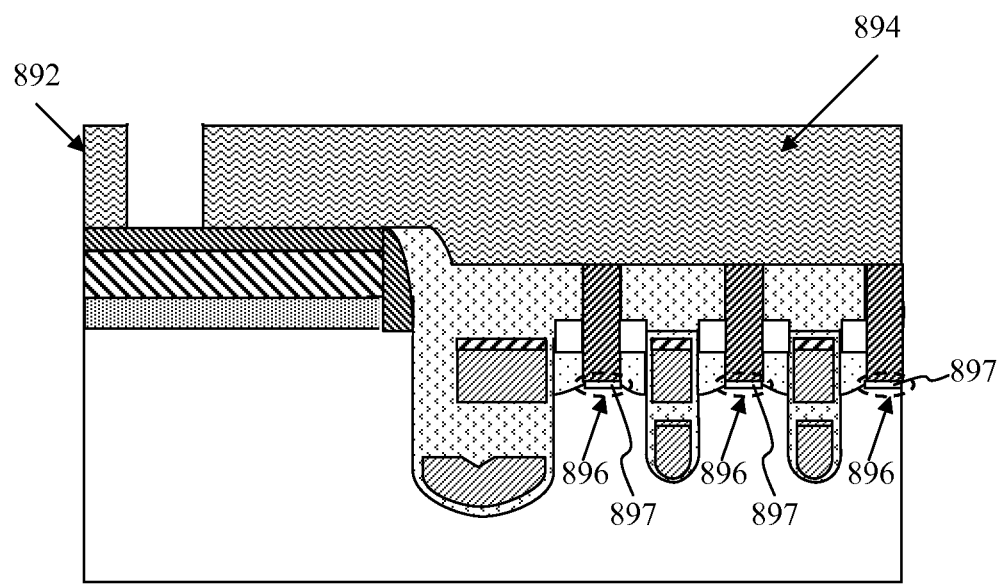

FIGS. 8Y and 8Z show alternative embodiments of the device of FIG. 8X. In FIG. 8Y, the contact trenches and the body regions are formed such that the bottom of the contact trenches end in the lightly doped (e.g. N-type) portions of the semiconductor substrate rather than in the body regions, thus forming Schottky diodes 895 at the bottom of the contact trenches. The device of FIG. 8Z is similar to the device of FIG. 8Y, except that a lightly doped implant 897 having the same conductivity type as the body regions is formed at the bottom of the contact trenches so that low injection efficiency P-N junction diodes 896 are formed at the bottom of the contact trenches. The Schottky diodes and low injection efficiency P-N junction diodes described in this invention are different from the normal P-N junction body diodes inherently present in MOSFETs; Schottky diodes and low injection efficiency P-N junction diodes are fast recovery diodes with little or no minority carrier injection.

Figure 9A:
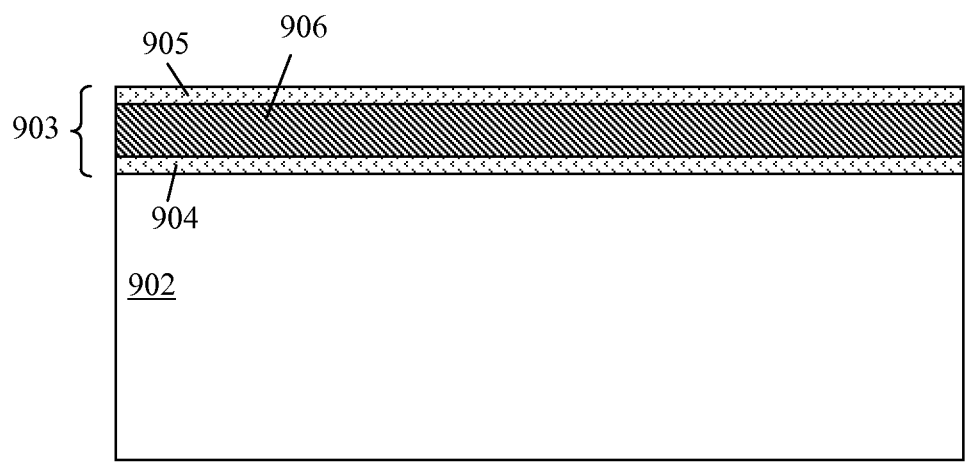
FIGS. 9A-9Z are cross sectional diagrams illustrating the alternative steps of fabrication the self aligned shielded gate trench MOSFET with integrated Schottky diode according to another embodiment of the present invention.
Figure 9B:
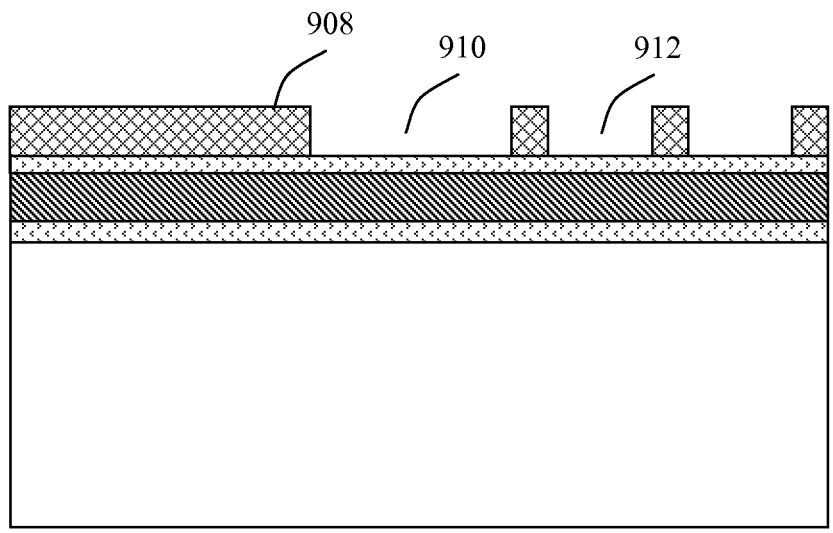
Figure 9C:
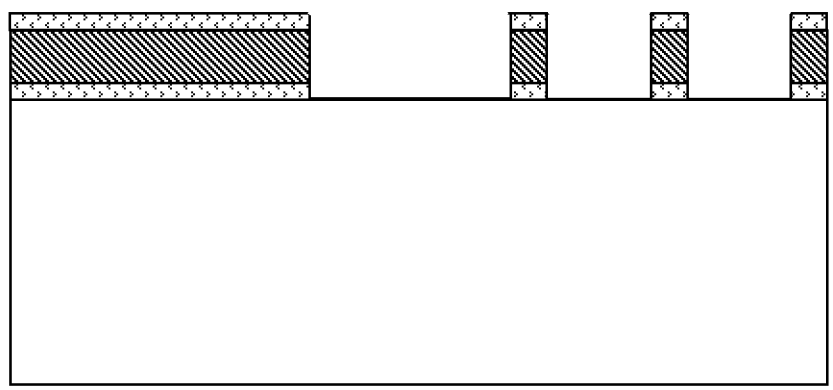
Figure 9D:
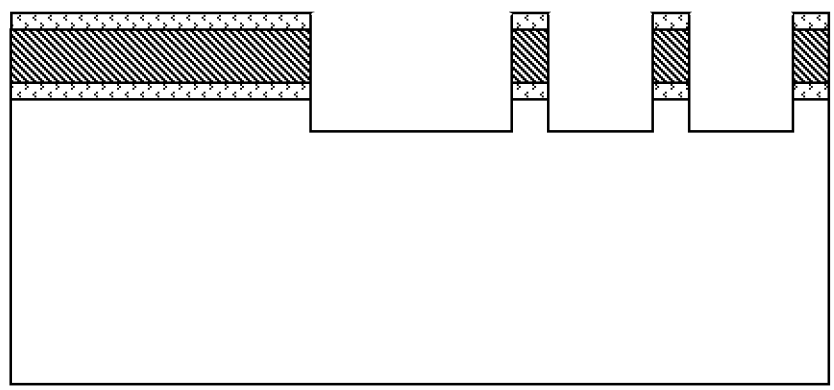
Figure 9E:
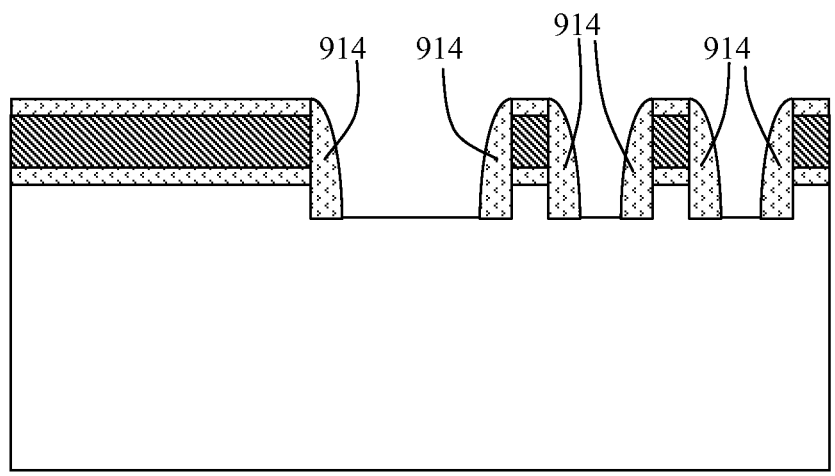
Figure 9F:
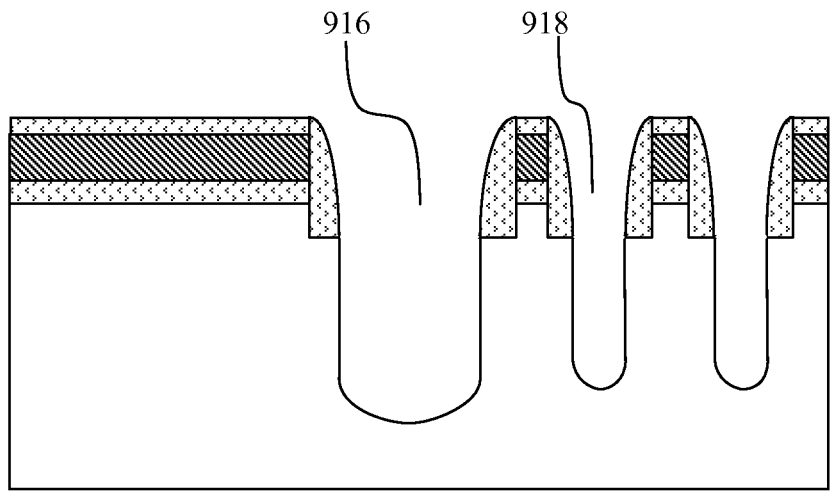
Figure 9G:
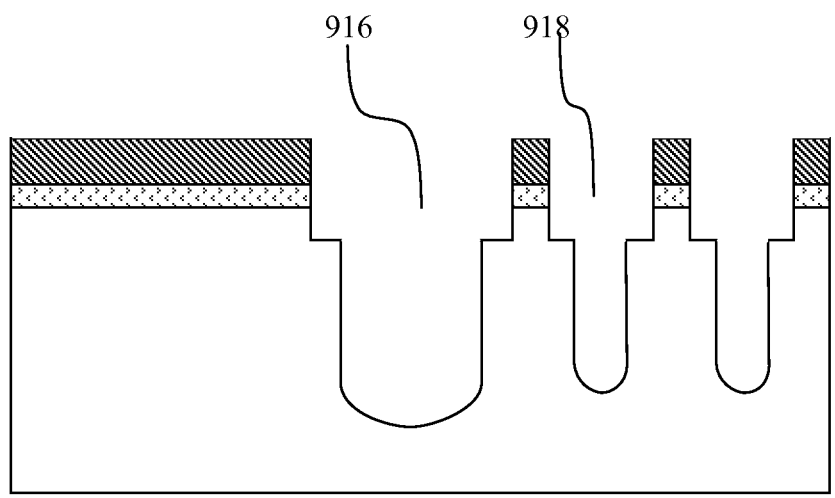
Figure 9H:
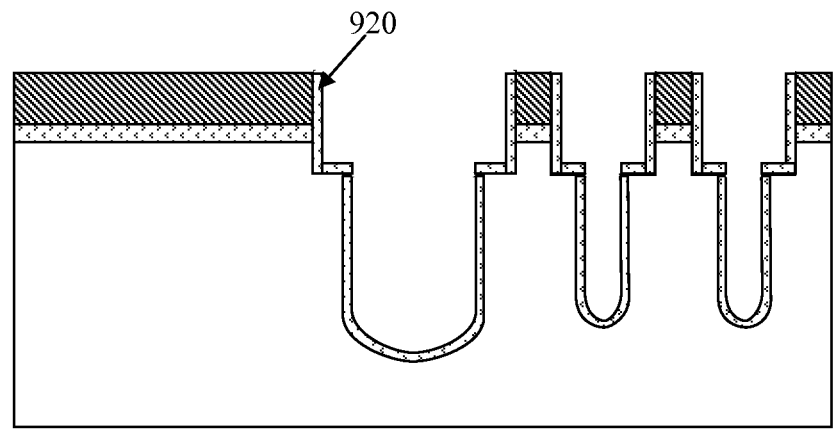
Figure 9I:
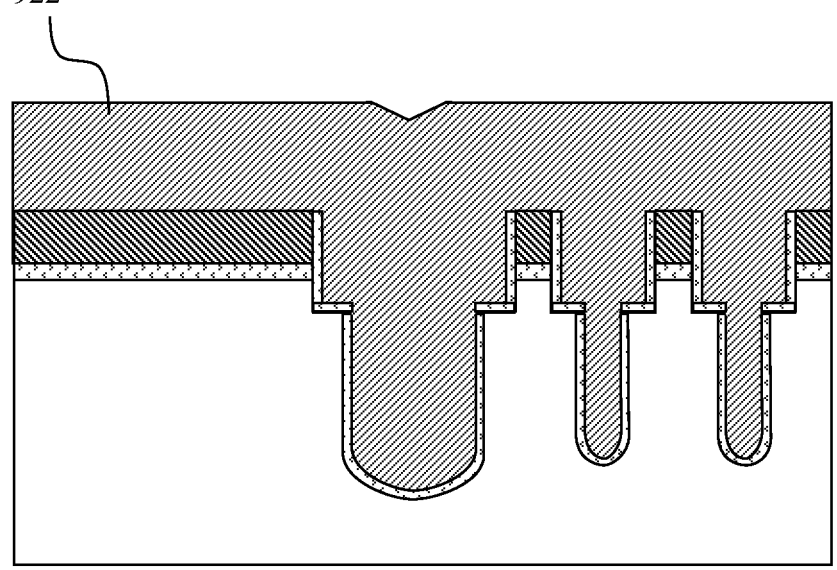
Figure 9J:
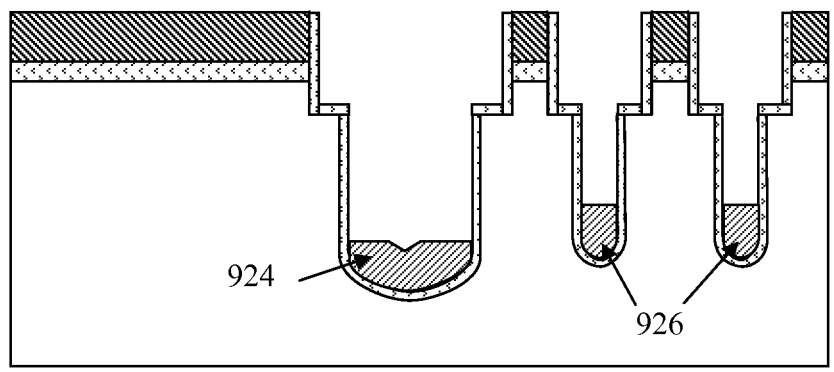
Figure 9K:
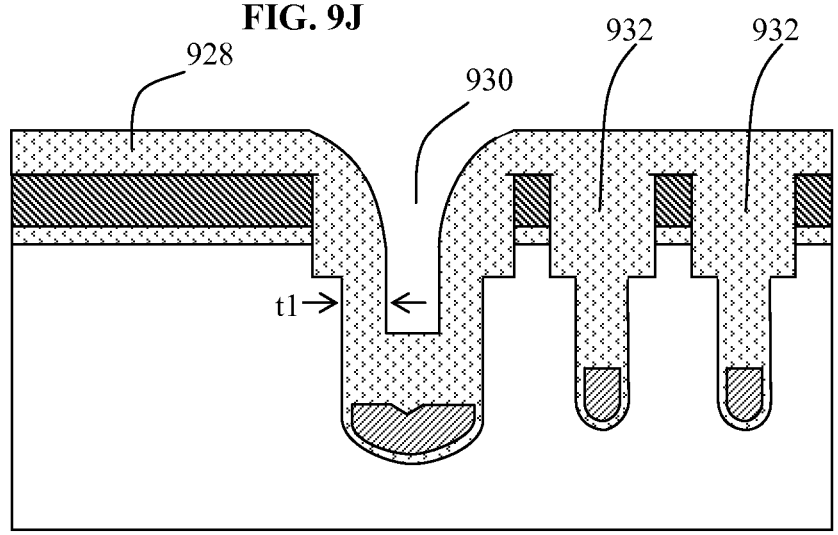
Figure 9L:
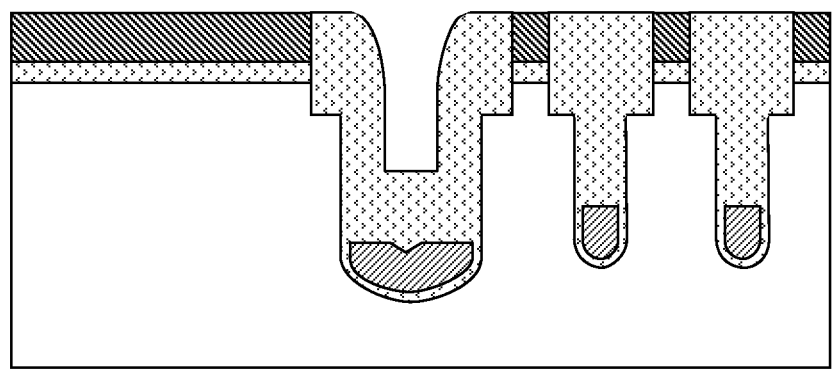
Figure 9M:
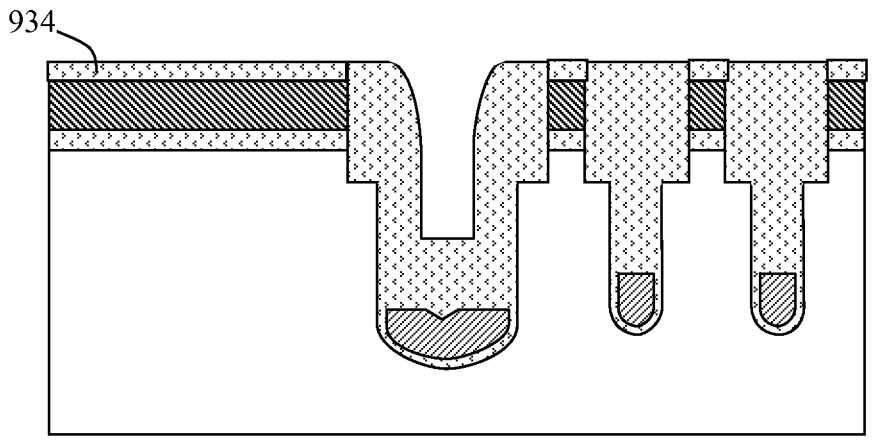
Figure 9N:
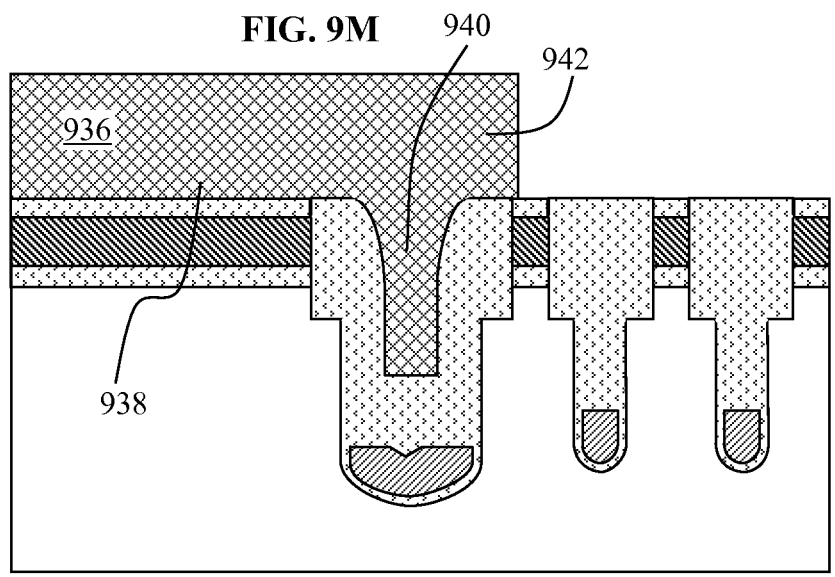
Figure 9O:
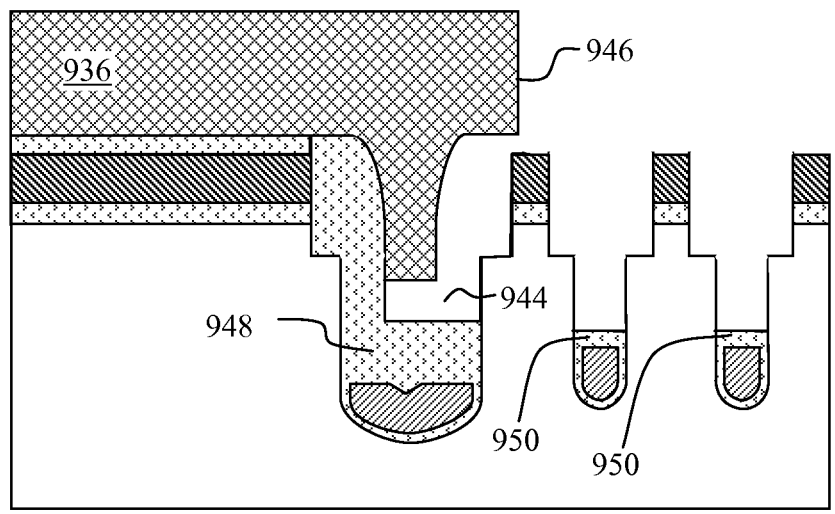
Figure 9P:
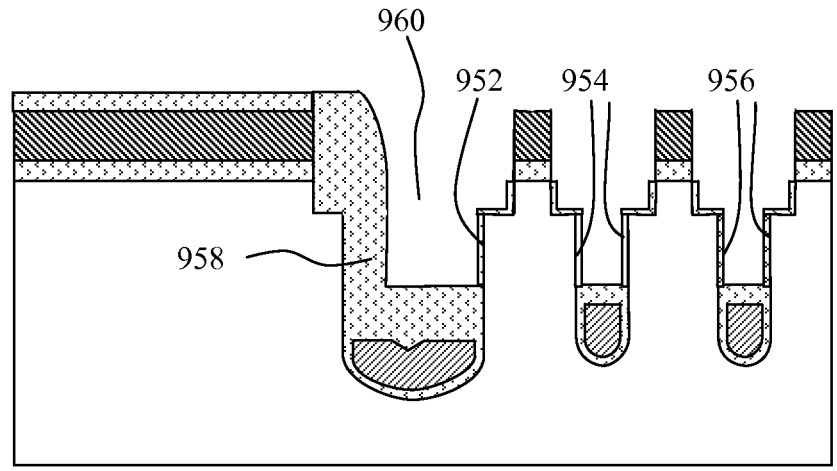
Figure 9Q:
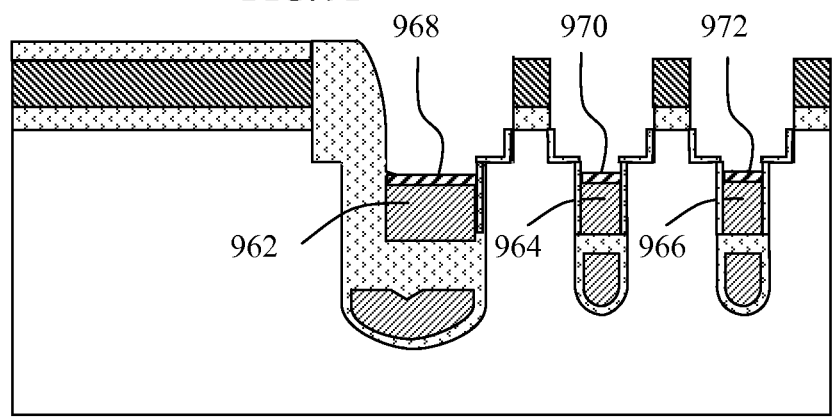
Figure 9R:
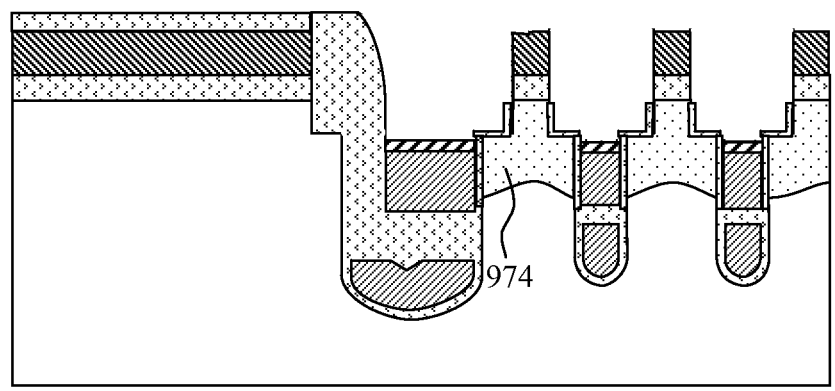
Figure 9S:
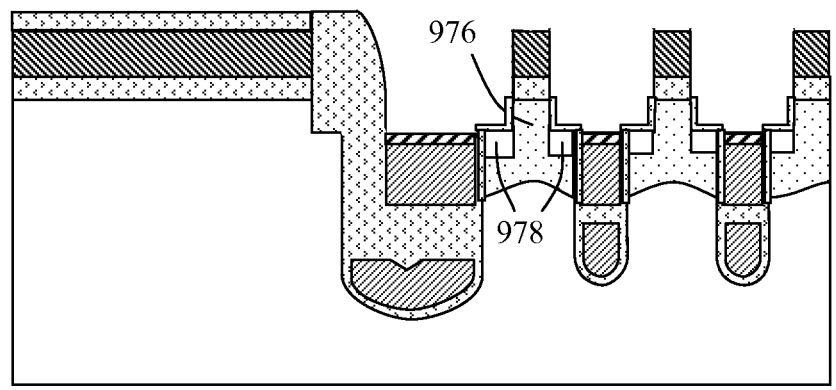
Figure 9T:
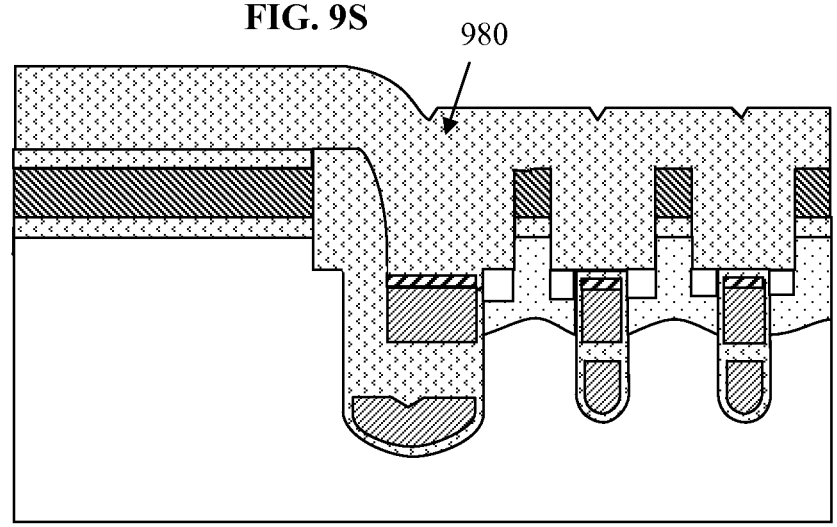
Figure 9U:
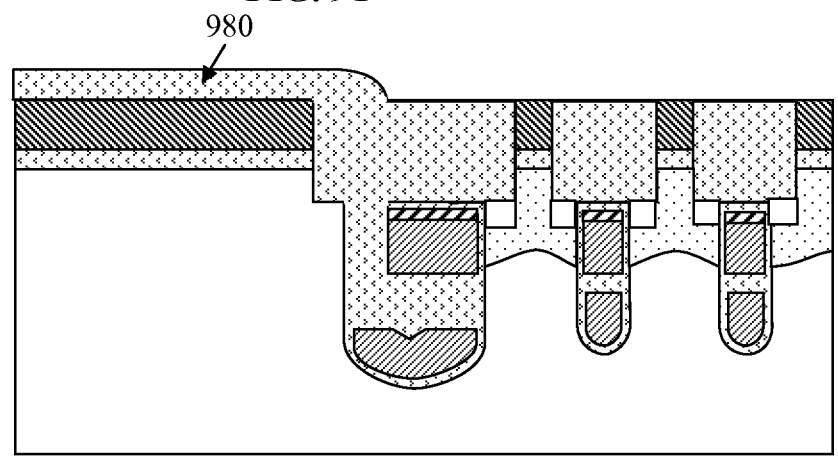
Figure 9V:
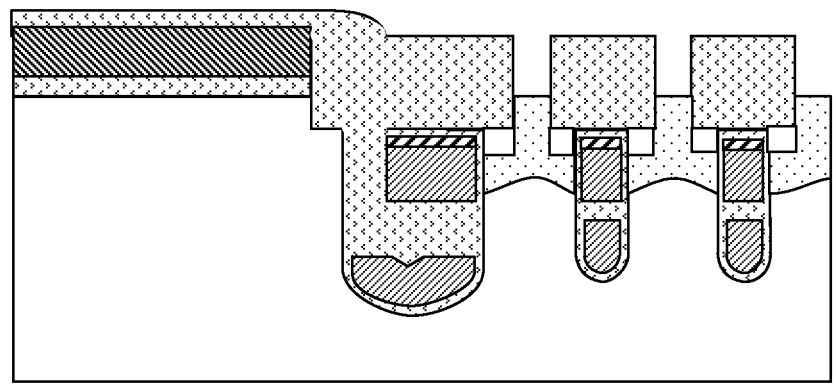
Figure 9W:
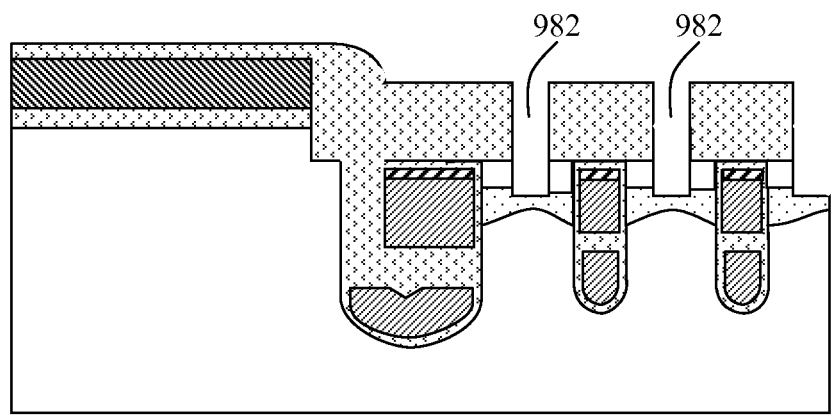
Figure 9X:
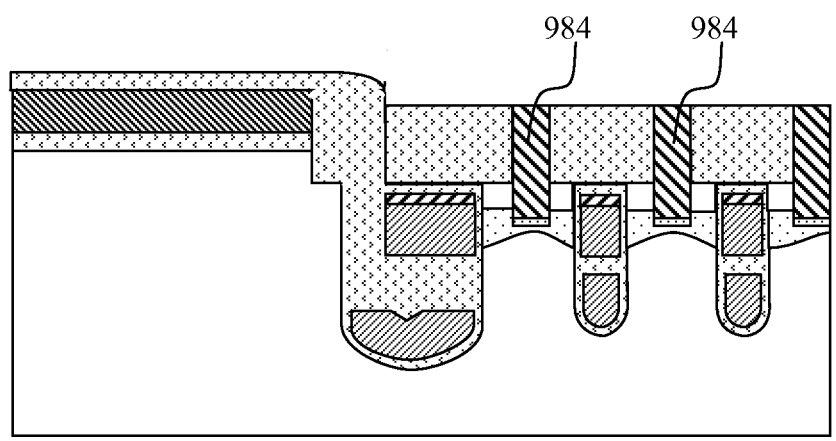
Figure 9Y:
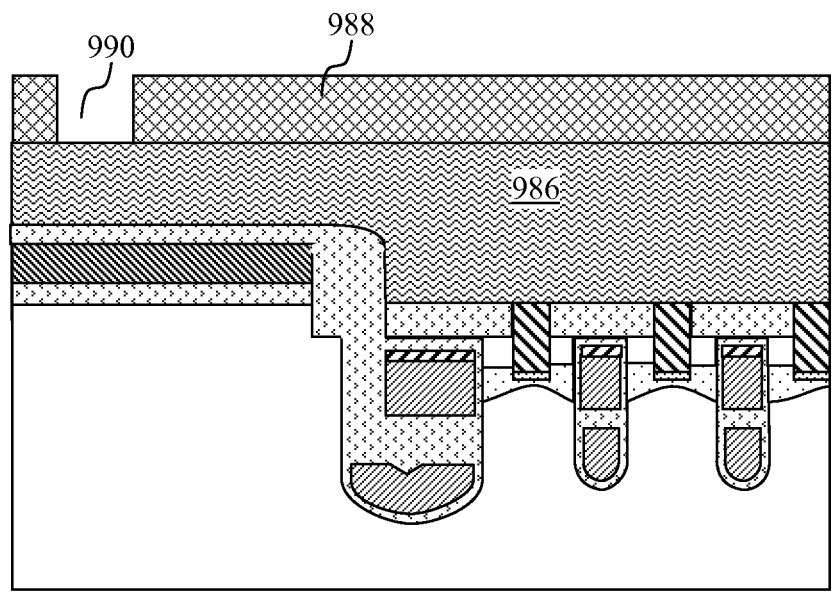
Figure 9Z:
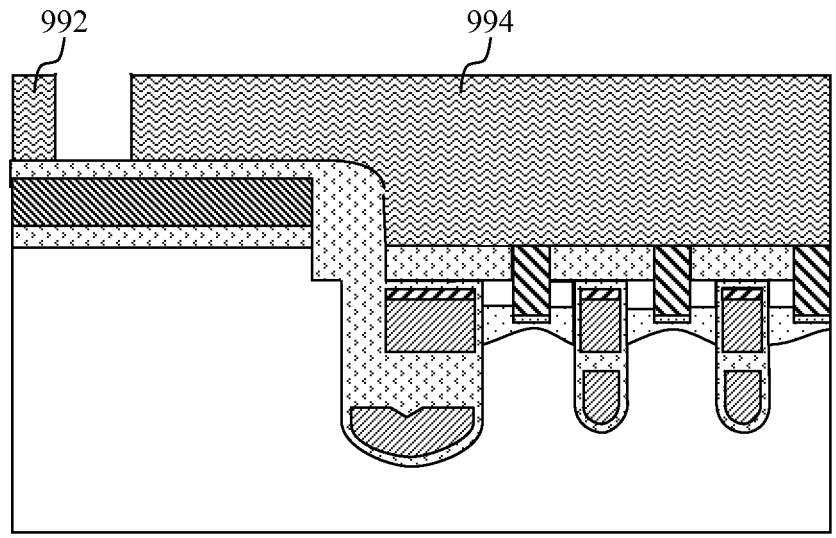

FIGS. 9A-9Z are cross sectional diagrams illustrating alternative steps of fabricating the self aligned shielded gate trench MOSFET with integrated Schottky diode according to another embodiment of the present invention.

As shown in FIG. 9A, an N-type semiconductor substrate 902 (e.g., an N type silicon wafer with an N-type epi layer grown on it for N-channel MOSFETs) is used as the drain of the device. The substrate 902 may alternatively be a P type silicon wafer with a P-type epi layer for P-channel MOSFETs. A sandwich or hard mask structure 903 is formed on the surface of the semiconductor substrate 902. In this example, the hard mask structure 903 can be an oxide-nitride-oxide (ONO) structure that includes a bottom thin oxide layer 904 and a top oxide layer 905 sandwiching a thick nitride layer 906, can be formed on the substrate 902. In some embodiments, the thickness of the nitride layer 906 is approximately 2500 Å to 5000 Å.

A photo resist (PR) layer 908 is then applied on top of the ONO hard mask structure 903 and patterned using a first mask as shown in FIG. 9B. The residual PR layer 908 forms a termination trench opening 910 and active gate trench openings 912. Next, a hard mask (HM) etch is performed to etch away exposed portions of the ONO hard mask structure 903 as shown in FIG. 9C. The remaining PR 908 is then removed, as shown in FIG. 9C. The remaining portions of the ONO hard mask structure 903 act as a hard mask for subsequent steps to etch top portions of the substrate 902 down to a predetermined depth as shown in FIG. 9D. Optionally, the semiconductor substrate does not need to be etched at this point, and trench (e.g., oxide or nitride) spacers may be formed in the hard mask openings over the top surface of the semiconductor substrate 902 like shown in FIG. 8D.

In FIG. 9E, a layer of oxide or nitride is deposited and anisotropically etched back. In some embodiments, the thickness of the oxide or nitride layer is approximately 2200 Å. Hard mask spacers (e.g., oxide spacers) 914 are thus formed along the trench walls after blanket anisotropic etch back.

Next, a blanket silicon etch step is performed to further deepen the trenches as shown in FIG. 9F. The resulting trench depth is on the order of about 1.5 μm to about 2.5 μm depending on device application, and the trench walls are sloped at an angle of approximately 87° to about 88°. The nitride spacers 914 allow for a self-aligned etching step that does not require an additional mask. A wider trench opening results in a deeper trench than a narrower trench opening due to the nature of the silicon etch loading factor. For example, since gate runner/termination trench opening 910 is wider than active gate trench opening 912, the resulting termination trench 916 is deeper than active gate trench 918, as shown in FIG. 9F.

The oxide spacer 914 can then be removed as shown in FIG. 9G. Optionally, the oxide spacers may be left on until later in the process, like shown in FIGS. 8A-8X.

As shown in FIG. 9H, an oxide liner 920 can be deposited or thermally grown on the sidewalls and the bottom of the trenches 916, 918. The oxide liner 920 is thicker than a gate oxide that will be formed later in the process. In some embodiments, a sacrificial oxide layer of approximately 500 Å can optionally be grown and removed to improve the silicon surface. By way of example, a layer of oxide of approximately 250 Å may be grown, followed by forming a layer of high temperature oxide (HTO) of approximately 900 Å. For a higher voltage device, the oxide liner 820 may be thicker e.g. 1000 to 5000 Å.

Conductive material, such as polysilicon (poly) 922 can be deposited, as shown in 9I. In some embodiments, the thickness of the conductive material can be approximately 12000 Å, which is greater than half the width of the widest trench. Thus, conductive material layers on the sidewalls can merge and completely fill all the trenches. This layer of conductive material is sometimes referred to as source poly, shield poly, or poly 1.

The conductive material 922 is then etched back using a dry etch, as shown in FIG. 9J. In this example, in the active gate trenches, the remaining conductive material 926 has a thickness of approximately 6000 Å, and in the termination trench, the remaining conductive material 924 has a thickness of approximately 3000 Å to 5000 Å.

An inter-polysilicon oxide (IPO) 928 is then deposited and densified as shown in FIG. 9K. The oxide on the trench sidewalls has a thickness (labeled as t1). In some embodiments, t1 may range from about 2000 Å to about 4000 Å to completely fill only the narrower trenches (such as active gate trenches and source poly pickup trenches), but only partially fill the wider trenches such as gate runner trench 930. Thus, the wider trenches are not completely filled leaving a gap to be utilized in a later step. In narrower trenches such as active trenches 932, the thickness of the oxide layer t1 is greater than half the width of the trench, and thus the oxide linings merge and completely fill the trench.

As shown in FIG. 9L, the IPO layer 928 is etched/polished back until the top surface of the oxide 928 is even with the nitride 906 surface, which serves as an etch stop.

FIG. 9M shows that another layer of oxide 934 is added. The thickness of the oxide layer may be about 1000 Å to about 2000 Å in some embodiments. The thickness of this oxide controls the degree of undercut of wet etching under a second mask in a subsequent etch step. This oxide film also protects the nitride in all the non-active areas of the device—this protected nitride allows for maskless blanket etching of the silicon later in the process.

A layer of photoresist 936 can then be spun on the surface of the structure and developed using a second mask. FIG. 9N shows the pattern of coverage by the photoresist 936 after selected portions have been removed following the developing process. The photoresist coverage extends into the termination region as indicated at 938, fills termination trench as indicated at 940, and extends over into the active area as indicated at 942. As will be shown in connection with FIG. 9O, a portion of the oxide under the PR will be removed by etching. Mask overlap and wet etch undercut together help determine the final profile. Thus, the distance of the photoresist coverage 936 extending into the active region in part determines in part how much oxide will be removed by etching. Other factors include etch time and the thickness of the oxide layers. The oxide undercut depth ranges from about 0.6 μm to about 1.5 μm.

Oxide wet etch can then be performed. Some oxide in areas unmasked by the photoresist can be removed, such that the remaining oxide is held at desired height. Some oxide near the edges of the photoresist can also be removed. In particular, a portion 944 of oxide in termination trench, located adjacent to the photoresist edge 946 can be removed. The amount of oxide that is etched can be controlled by adjusting the position of the edge 946 and the etch time. Extending the edge 946 further into the active region would result in less oxide being etched, and pulling the edge away from the active region would have the opposite effect. The amount of oxide etched away can vary in different embodiments. In the example shown, enough oxide can be etched away such that the remaining inter-poly oxide 948 is approximately uniform in thickness. It may be desired for the initial bottom oxide layer 904 to be very thin, to minimize the amount of etchant that can seep under the nitride layer 906 during the wet etch. Alternatively, the spacers from earlier may be retained up to this point for protection. The oxide layer above the conductive material in the trenches, such as oxide layers 948 and 950, is also referred to as the inter-electrode dielectric (IED) or inter-poly dielectric (IPD). The oxide covering the termination region is sometimes referred to herein as the termination protection region. The inter-electrode dielectric can range from a few hundred to a few thousand angstroms in thickness.

The photoresist 936 is then removed, and a layer of gate oxide is deposited or thermally grown. In some embodiments, the added oxide layer is approximately 450 Å thick. Thus, as shown in FIG. 9P, gate oxides 952, 954, and 956 are formed on the exposed trench walls. Termination trench 960 has asymmetric oxide coverage on its sidewalls, with a thick oxide 958 on the termination area side, and a thin oxide 952 on the active area side.

Another conductive material (e.g., polysilicon) deposition and etch back can be performed, as seen in FIG. 9Q. By way of example, and not by way of limitation, approximately 8000 Å to 12000 Å of polysilicon can be deposited in various trenches. The deposited poly can be etched back, forming gate poly indicated at 962, 964, 966. In the example shown, the poly surface may be recessed approximately 500-1000 Å below the hard mask spacer bottom reference level. A layer of suitable metal such as titanium or cobalt can be deposited and annealed to form polycide structures 968, 970, 972 where the metal is in contact with the poly at 962, 964, 966. Metal deposited on the oxide or nitride does not form silicide or polycide and can be easily removed by a process that does not remove the silicide/polycide.

As shown in FIG. 9R, a body implant can then be performed, e.g., by bombarding the partially fabricated device with dopant ions. The ions may be implanted at an angle. In active areas unprotected by nitride, the implant forms body regions such as 974. In some embodiments, Boron ions with a dosage level of approximately $1.8 \times 10^{13}$ ions/cm$^2$ at 60 KeV~180 KeV are used for an N-channel device. Other types of ions can be used. For example, Phosphorous ions can be used for P-channel devices.

In FIG. 9S, source implant takes place (e.g. with a zero tilt angle (i.e., at normal incidence)). The device is again bombarded with dopant ions. In some embodiments, Arsenic or Phosphorus ions (for N-channel devices) with a dosage level of about $4 \times 10^{15}$ ions/cm$^2$ at about 40 KeV to about 80 KeV can be used. Source regions such as 978 are formed within body regions such as 976. For P-channel devices, Boron ions can be used to form the source regions.

No additional photoresist mask is required to implant the body and the source of the device. The body and source implants can be performed as self-aligned blanket implants. In termination areas, the oxide-nitrite-oxide hard mask structure blocks implant ions and prevents source and body regions from being formed, thus improving device behavior in its off or blocking state.

An insulator 980, such as oxide, ranging from about 5000 Å to about 8000 Å can be deposited, filling in trench openings over the gate poly regions as shown in FIG. 9T. In some embodiments, a chemical vapor deposition (CVD) process is used to deposit Low Temperature Oxide (LTO) and Borophosphorosilicate Glass (BPSG) to a thickness of approximately 5000 Å.

As seen in FIG. 9U, the insulator 980 can be etched back, e.g., using a dry etch process. The etch process can be stopped by endpoint etch at the nitride layer 906, which can act as a self-aligned hard mask for the next step.

As shown in FIG. 9V, the exposed nitride 906/oxide 904 hard mask can be etched back to the silicon substrate 902. The silicon substrate 902 may be further etched to form source/body contact trenches 982, for contact to the source and body regions as shown in FIG. 9W. The silicon etch depth can range from about 0.6 μm to about 0.9 μm depending on device applications. Exposed silicon areas are etched, while areas protected by oxide and/or nitride are not etched. Since the etching process does not require an additional mask, it is referred to as a self-aligned contact process. The self-aligned nature of the active cell contact trenches is made possible because the spacers formed near the beginning of the process preserved semiconductor mesas between trenches.

In FIG. 9X, barrier metal such as Ti and TiN can be deposited, followed, e.g., by rapid thermal processing (RTP) to form Ti silicide near the contact region. The thicknesses of Ti and TiN used in some embodiments can be 300 Å and 1000 Å, respectively. Tungsten (W) can then be blanket deposited. In some embodiments about 4000 Å to 6000 Å of W may be deposited. The deposited W can be etched back up to the oxide surface to form individual W plugs 984. Before the barrier metal deposition, a P+ implant may optionally be performed at the bottom of the contact trenches for a better body contact if the body region is P type (e.g., when the substrate is an N type substrate). Alternatively, an N+ implant may be performed if the body region is N type (e.g., when the substrate is a P type substrate). For an integrated Schottky diode, the trench contact 984 could be etched all the way through to the portion of the substrate 902 below the body regions (e.g. the epi layer portion of the substrate below the body regions).

A fourth mask can be used to form a source metal region and a gate metal region. Specifically, as shown in FIG. 9Y, a metal layer 986 such as Aluminum-Copper (AlCu) can be deposited over the semiconductor substrate. By way of example, and not by way of limitation, the metal layer can be about 3 μm to about 6 μm thick. Photoresist 988 can then be deposited and patterned using the metal mask. Metal under openings such as 990 left by the patterning process can then be etched away to divide the metal layer into electrically isolated source metal and gate metal regions.

After residual photoresist is removed, the metal can be annealed. In some embodiments, the metal may be annealed at 450° C. for 30 minutes. FIG. 9Z is a cross sectional diagram illustrating an example of a completed device with a gate metal 992 and a source metal 994.

Embodiments of the present invention provide for self-aligned fabrication of transistor devices such as MOSFET devices where source, body, and contact trenches are all self-aligned. This allows fabrication of devices with a smaller pitch than previous processes with fewer masks and without misalignment issues.

Figure 10:
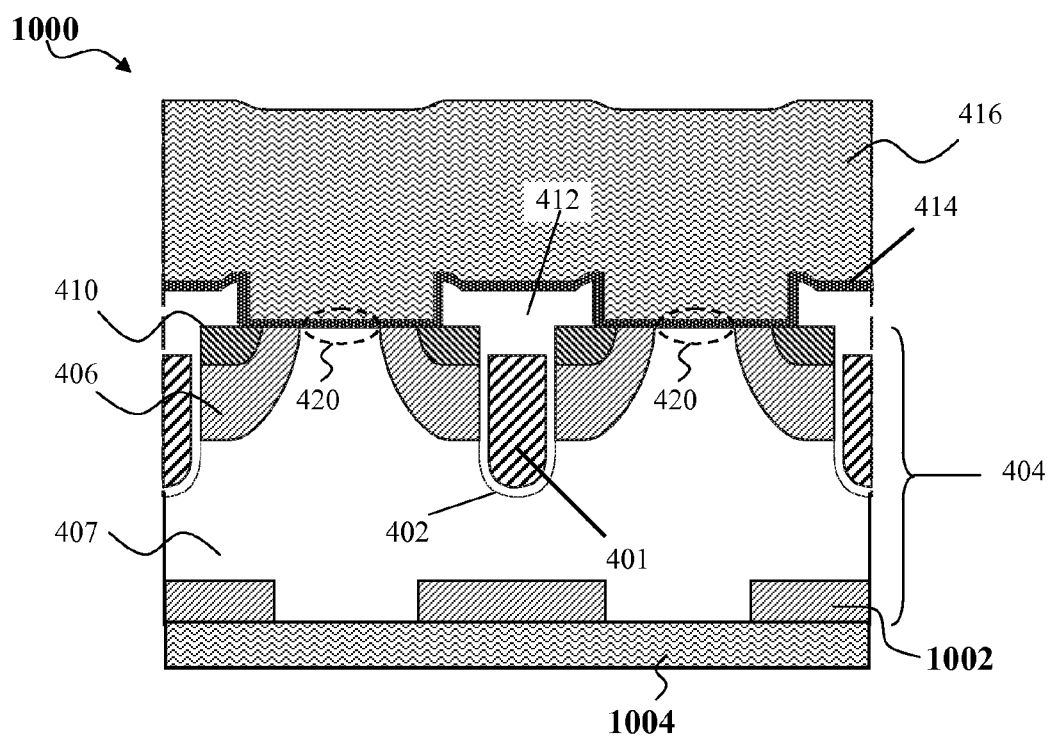
FIG. 10 is a cross-sectional diagram illustrating a trench insulated gate bipolar transistor (IGBT) according to an alternative embodiment of the present invention.

While the above is a complete description of the preferred embodiment of the present invention, it is possible to use various alternatives, modifications and equivalents. For example, the nitride spacers may have been left on the device for FIGS. 9A-9Z, until the body region implant, like shown in FIGS. 8A-8X. Also, the process shown in FIGS. 8A-8X may have used an initial ONO hard mask with a thick nitride, like that shown in FIG. 9A. Also embodiments of the present invention could be applicable to insulated gate bipolar transistor (IGBT) devices by adding a collector region; by way of example, the collector region can be a layer at the bottom of the semiconductor substrate having opposite conductivity type as the rest of the semiconductor substrate. IGBT devices are three-terminal power semiconductor devices, noted for high efficiency and fast switching. The IGBT combines the metal oxide semiconductor (MOS) gate-drive characteristics of a MOSFET with the high-current and low-saturation-voltage capability of a bipolar transistor by combining an isolated gate FET for the control input, and a bipolar power transistor as a switch, in a single device. By way of example, and not by way of limitation, FIG. 10 depicts an example of an IGBT device 1000 fabricated in accordance with an alternative embodiment of the present invention. The device 1000 is similar to the MOSFET device 400 depicted in FIG. 4. Consequently, the same reference numerals are used to refer to the features common to both devices. Features common to both devices are as described above with respect to FIG. 4. In addition to the common features, the IGBT device 1000 further includes a collector region 1002 located near a side of the semiconductor wafer 404 opposite the side where the trenches 402 are formed. The collector region is doped with dopants of an opposite polarity to the doping of the semiconductor wafer 404. For example, if the rest of wafer 404 is N-type doped, the collector region 1002 may be doped P-type. Similarly, if the wafer 404 is doped P-type, the collector region 1002 can be doped N-type. A collector electrode 1004 may be formed on the surface of the wafer closest to the collector region 1002, e.g., by depositing a suitable metal. In order for the Schottky diode of IGBT device 1000 to be able to operate, the collector region 1002 may need to be patterned so that there are areas where the collector electrode 1004 can contact the substrate between collector regions. It is noted that the device 1000 may be fabricated using the process described above with respect to FIG. 5A-FIG. 5L with an additional step of forming the collector region 1002, e.g., by implantation of the backside of the wafer with suitable dopants. Such implantation may take place at any convenient point in the processing, e.g., before forming the trenches or after the device is otherwise complete. The electrode 1004 can be formed at any convenient point in the processing, e.g., by metal deposition after implantation.

Figure 11A:
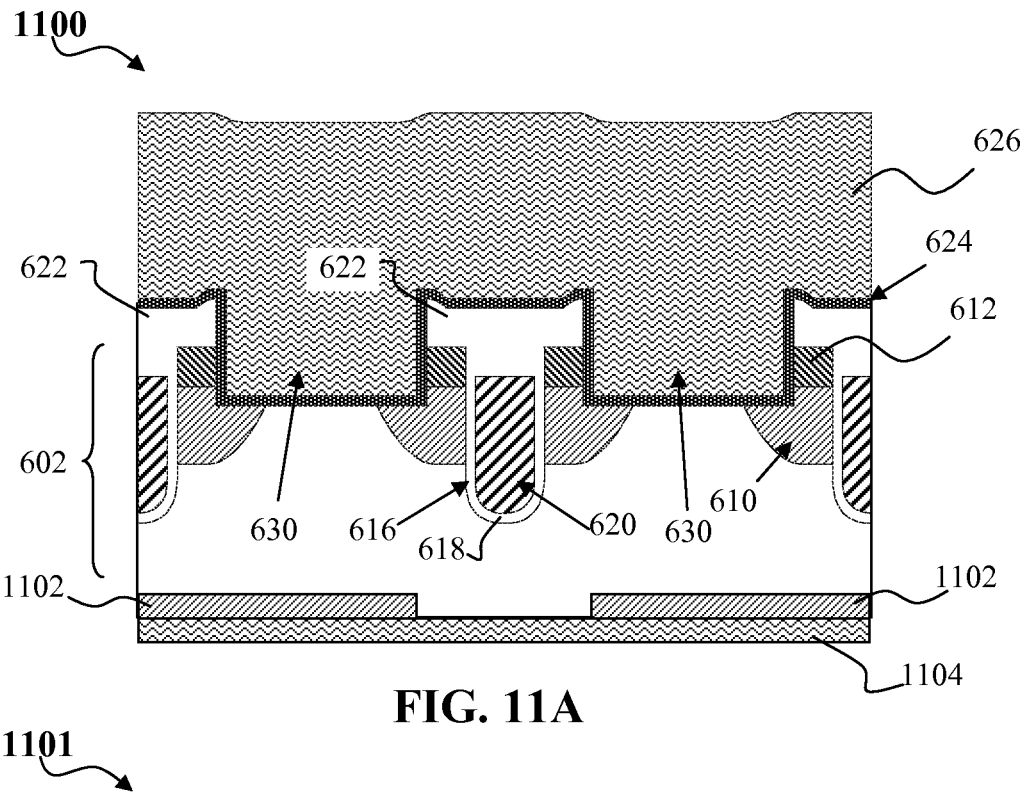
FIGS. 11A-11B are cross sectional diagrams illustrating self aligned trench IGBT devices with integrated Schottky diode according to another alternative embodiment of the present invention.
Figure 11B:
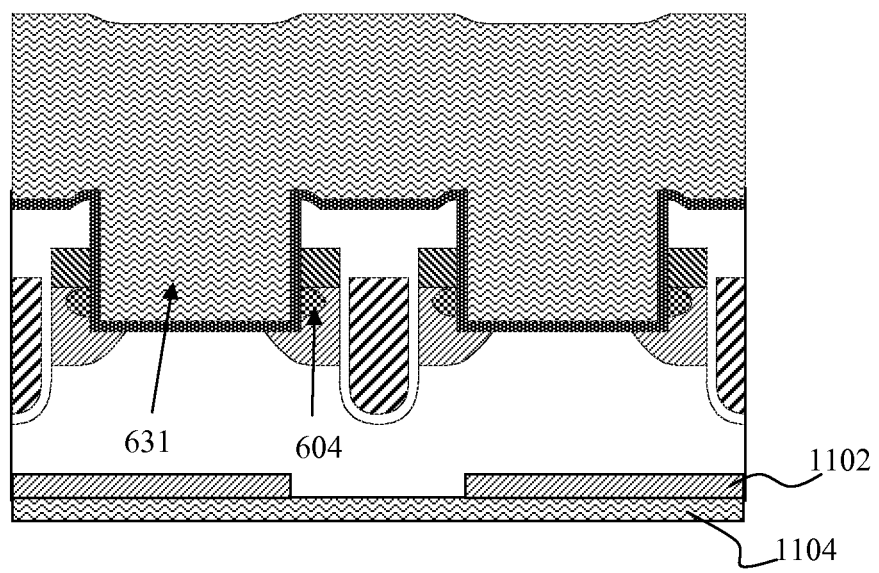

It is noted that devices similar to the MOSFET devices 600, 601 of FIGS. 6A, 6B respectively may be configured as IGBT devices 1100, 1101 respectively as shown in FIG. 11A and FIG. 11B. The construction of IGBT devices 1100, 1101 is similar to that of devices 600, 601 respectively and features common to the devices are indicated by common reference numerals. The IGBT devices 1100, 1101 further include collector regions 1102 and (optionally) collector electrodes 1104.

Figure 12A:
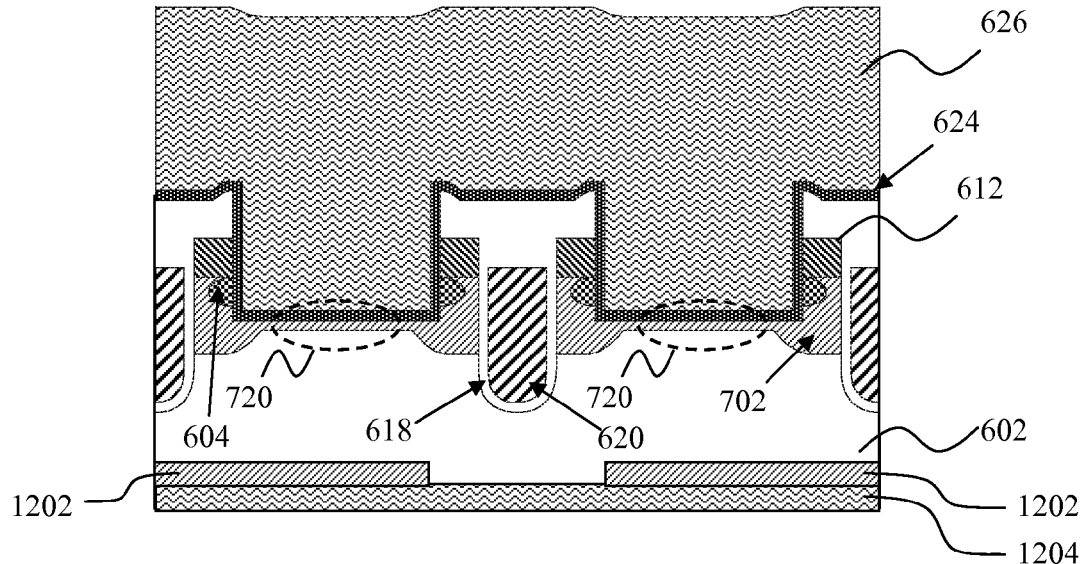
FIGS. 12A-12B are cross sectional diagrams illustrating self aligned trench IGBT devices with integrated Schottky diode according to another alternative embodiment of the present invention
Figure 12B:
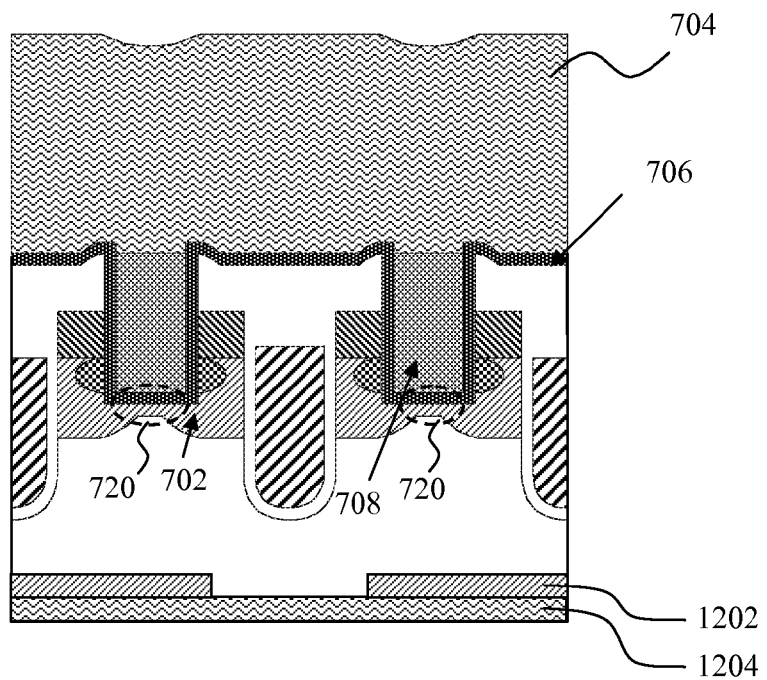

It is further noted that devices similar to the MOSFET devices 700, 701 of FIGS. 7A, 7B respectively may be configured as IGBT devices 1200, 1201 respectively as shown in FIG. 12A and FIG. 12B. The construction of IGBT devices 1200, 1201 is similar to that of devices 700, 701 respectively and features common to the devices are indicated by common reference numerals. The IGBT devices 1200, 1201 further include collector regions 1202 and (optionally) collector electrodes 1204.

It is noted that IGBT devices may be fabricated using the processes set forth in FIGS. 8A-8X and FIGS. 9A-9Z with an additional step of forming a collector region, e.g., by implanting suitable dopants into the backside of the wafer on which the devices are formed. Such implantation may take place at any convenient point in the processing, e.g., before forming the trenches or after the device is otherwise complete, or after a backside grinding step. A collector electrode can be formed on the backside of the wafer at any convenient point in the processing, e.g., by metal deposition after dopant implantation.

Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for fabricating a semiconductor device, comprising:
   a) forming a hard mask structure on a semiconductor substrate, wherein the hard mask structure comprises one or more layers;
   b) forming first openings and one or more second openings in the hard mask structure, wherein the second openings are wider than the first openings;
   c) forming spacers at walls of the openings in the hard mask structure;
   d) forming gate trenches and one or more termination trenches by etching exposed regions of the substrate, wherein the spacers define sidewalls of the trenches, wherein the first openings define the gate trenches, and wherein the second openings define the one or more termination trenches;
   e) forming a gate insulator at the sidewalls of the trenches;
   e') forming a second conductive region in the trenches such that the first conductive region is later formed on top of the second conductive region in the trenches with an inter-electrode dielectric layer formed between the first and second conductive regions;
   forming a second insulating layer on top of the second conductive region, wherein the second insulating layer has a thickness less than one-half of the width of the one or more termination trenches but greater than one-half of the width of the gate trenches;
   forming a photoresist that fills the one or more termination trenches and does not completely cover an active region defined by the gate trenches;
   removing a portion of the second insulating layer underneath the photoresist; and
   removing the photoresist;
   f) filling the trenches with a first conductive material and etching back the first conductive material to form a first conductive region, wherein a top surface of the conductive region is recessed below a top surface of the substrate;
   g) prior to step f), forming a second conductive region in the trenches such that the first conductive region is formed on top of the second conductive region in the trenches with an inter-electrode dielectric layer formed between the first and second conductive regions;
   h) after forming the second conductive region and prior to forming the first conductive region, forming a second insulating layer on top of the second conductive region, wherein the second insulating layer has a thickness less than one-half of the width of the one or more termination trenches but greater than one-half of the width of the gate trenches;
   i) forming a photoresist that fills the one or more termination trenches and does not completely cover an active region defined by the gate trenches;
   j) removing a portion of the second insulating layer underneath the photoresist, whereby the inter-electrode dielectric layer is formed;
   k) removing the photoresist;
   l) at some point before, during, or after a)-k), forming one or more source regions and one or more body regions, wherein the body regions are formed at selected regions of a top portion of the substrate and the source regions are formed at top portions of the body regions;
   m) forming a first thick insulating layer on top of the first conductive material region, wherein the first thick insulating layer comes up against the hard mask structure; and
   n) removing the hard mask structure using said first thick insulating layer as an etch mask to expose the semiconductor substrate under the hard mask structure, wherein the bottommost layer of the hardmask and the first thick insulating layer are oxides, and forming source/body contact trenches by etching into the semiconductor substrate using the first thick insulating layer as an etch mask, wherein said forming source/body contact trenches is performed without forming additional spacers after said removing the hard mask structure.

2. The method of claim 1, further comprising removing the spacers of the gate trenches before said forming the first thick insulating layer.

3. The method of claim 2, wherein l) is performed after removing the spacers.

4. The method of claim 1, wherein the spacers comprise oxide or nitride.

5. The method of claim 1 wherein the hard mask structure comprises a sandwich structure and includes a thin oxide layer formed on the substrate and two or more additional layers formed on the thin oxide layer.

6. The method of claim 5, wherein the hard mask structure includes a polysilicon (poly) layer on top of the thin oxide layer and a nitride layer on top of the poly layer.

7. The method of claim 5, wherein the hard mask structure includes an oxide-nitride-oxide layer (ONO) structure.

8. The method of claim 1, before c) further comprising etching into the semiconductor substrate through said openings in the hard mask structure.

9. The method of claim 1, wherein there is no etching into the semiconductor substrate through said openings in the hard mask structure before c).

10. The method of claim 1, further comprising:
    j) forming a source metal and a gate metal after removing the hard mask structure, wherein an integrated diode is formed at a junction between the metal and the substrate.

11. The method of claim 10, wherein step j) further includes:
    forming a metal diffusion barrier on top of the substrate after removing the hard mask structure.

12. The method of claim 10, wherein the metal, at least one of the one or more body regions and substrate are configured such that the integrated diode is a Schottky diode.

13. The method of claim 10, wherein the metal, at least one of the one or more body regions and substrate are configured such that the integrated diode is a low injection efficiency P-N junction diode.

14. The method of claim 1, further comprising forming a collector region at a side of the substrate opposite a side where the gate trenches are formed, wherein the collector region is characterized by a doping of a polarity type opposite that of the doped substrate, whereby the semiconductor device is an insulated gate bipolar transistor (IGBT).

* * * * *